(12) United States Patent
Kito

(10) Patent No.: US 7,151,290 B2
(45) Date of Patent: Dec. 19, 2006

(54) SEMICONDUCTOR MEMORY DEVICE AND METHOD OF MANUFACTURING THE SAME

(75) Inventor: Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 10/898,358

(22) Filed: Jul. 26, 2004

(65) Prior Publication Data
US 2005/0253188 A1   Nov. 17, 2005

(30) Foreign Application Priority Data
Apr. 23, 2004   (JP)   ............................. 2004-128071

(51) Int. Cl.
    *H01L 27/108*   (2006.01)
(52) U.S. Cl. .................. 257/301; 257/305; 257/332
(58) Field of Classification Search ................ 257/301, 257/305, 332
    See application file for complete search history.

(56) References Cited

U.S. PATENT DOCUMENTS 5,736,750 A *   4/1998   Yamazaki et al. ............ 257/59
2005/0048715 A1 *   3/2005   Rupp et al. .................. 438/244

FOREIGN PATENT DOCUMENTS

| JP | 6-120446 | 4/1994 |
|---|---|---|
| JP | 6-209088 | 7/1994 |
| JP | 11-177043 | 7/1999 |
| JP | 2001-345433 | 12/2001 |

OTHER PUBLICATIONS

U.S. Appl. No. 10/644,415, filed Aug. 20, 2003, Kito et al.
U.S. Appl. No. 10/806,398, filed Mar. 23, 2004, Kito et al.

* cited by examiner

*Primary Examiner*—Long Pham
(74) *Attorney, Agent, or Firm*—Oblon, Spivak, McClelland, Maier & Neustadt, P.C.

(57) ABSTRACT

A semiconductor device includes a conductive film that is filled in a trench formed in a semiconductor substrate via a first insulating film. The conductive film has a first portion and a second portion with an upper surface higher than the first portion. A second insulating film provided on the first portion of the conductive film has a first portion and a second portion whose upper surface is higher than the surface of the semiconductor substrate. The first portion of the second insulating film contacts the second portion of the second insulating film and has an upper surface lower than the surface of the second portion of the conductive film. A first gate electrode and a second gate electrode are provided on the second insulating film and above the semiconductor substrate, respectively. A connection conductive layer extends on the conductive film and on one of source/drain diffusion layers.

12 Claims, 34 Drawing Sheets

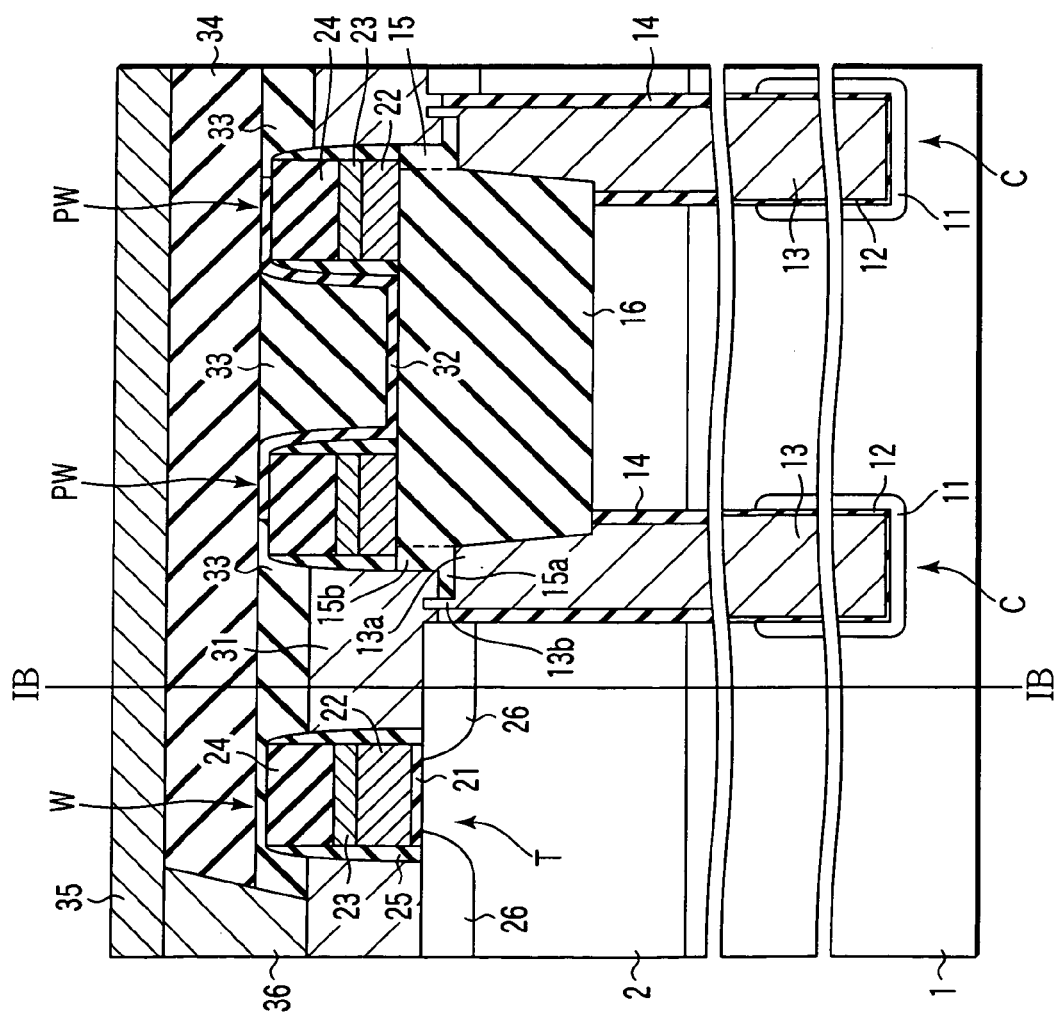
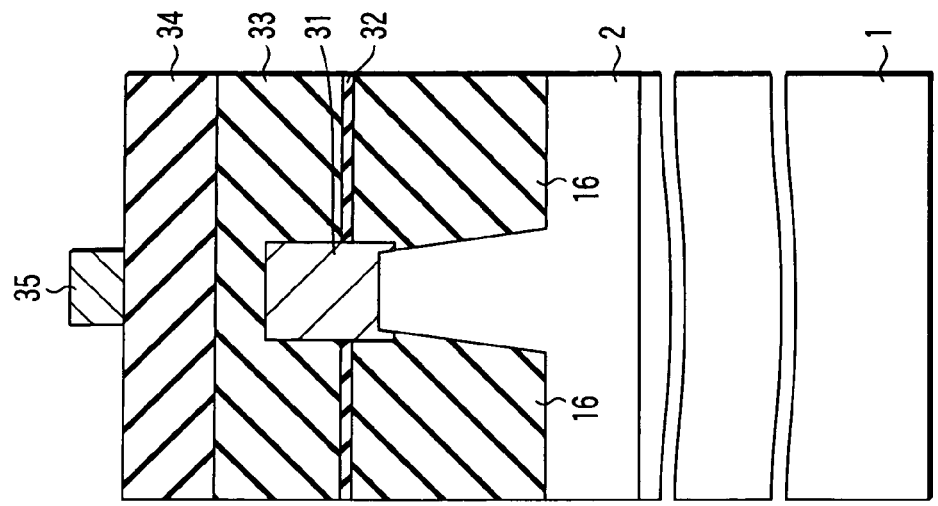
FIG. 1A
FIG. 1B

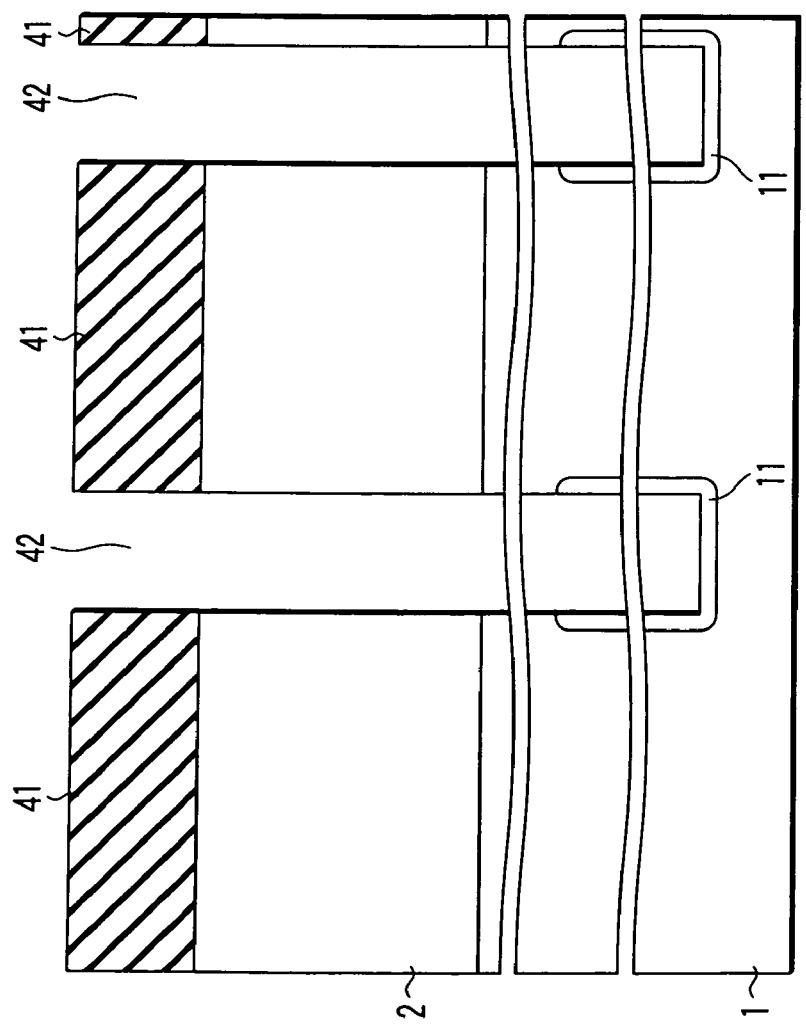
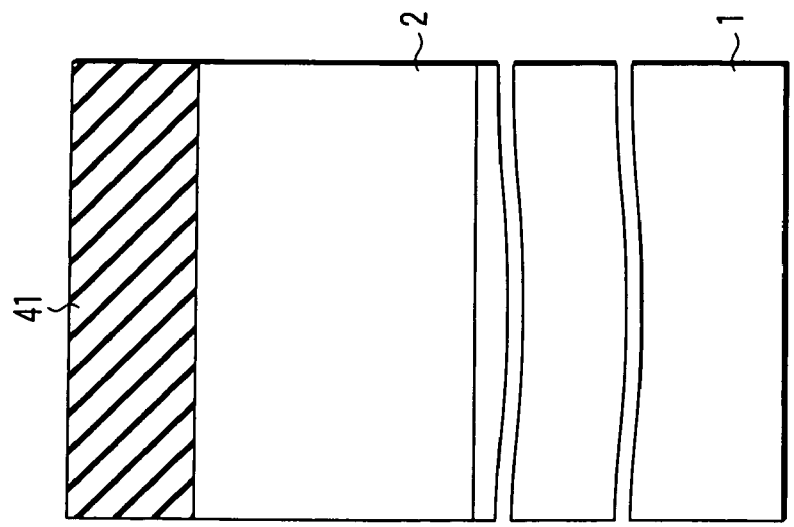

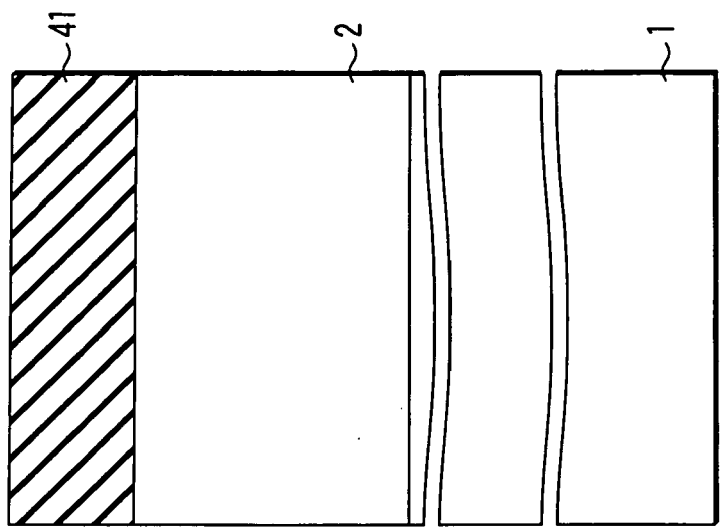
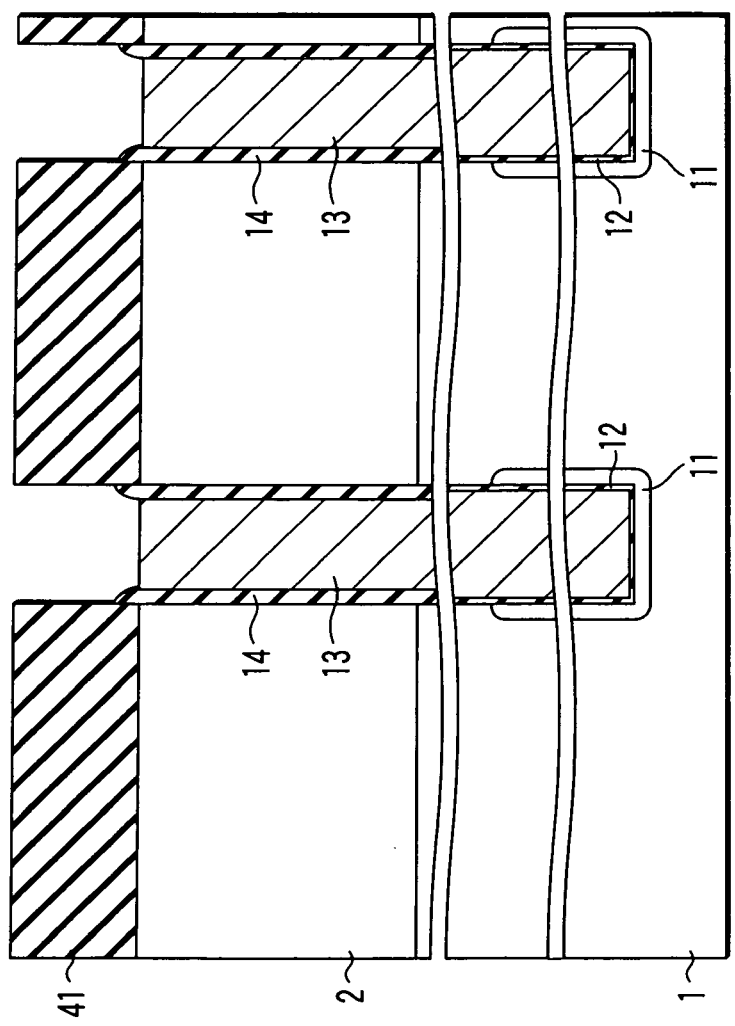
FIG. 3A
FIG. 3B

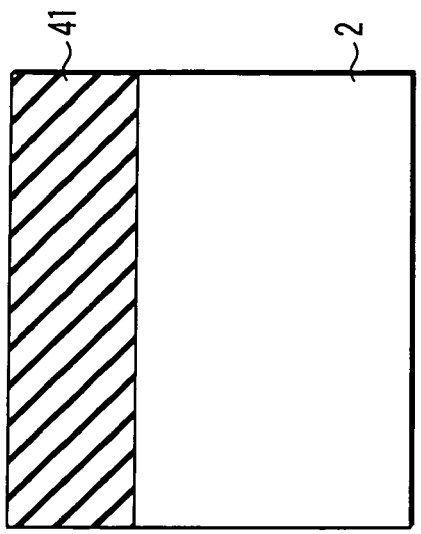
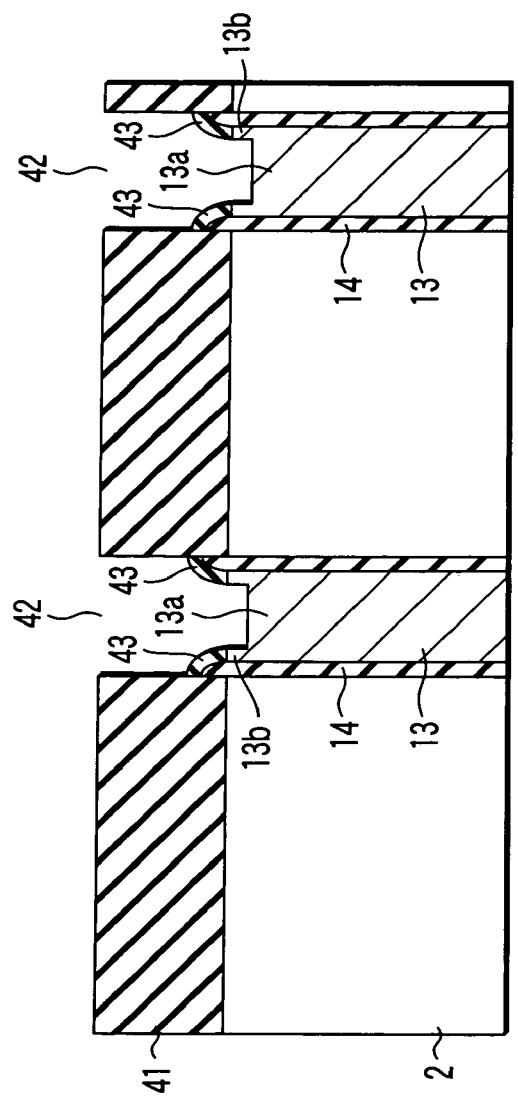
FIG. 5B
FIG. 5A

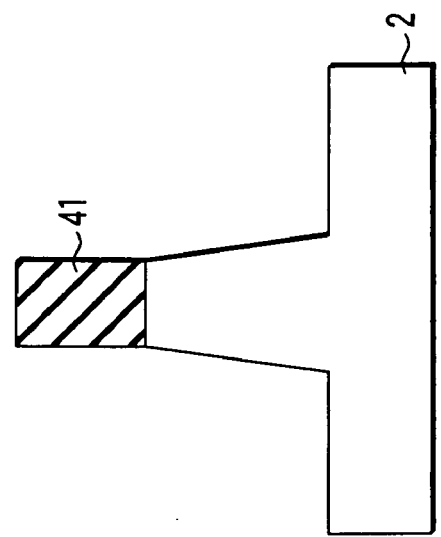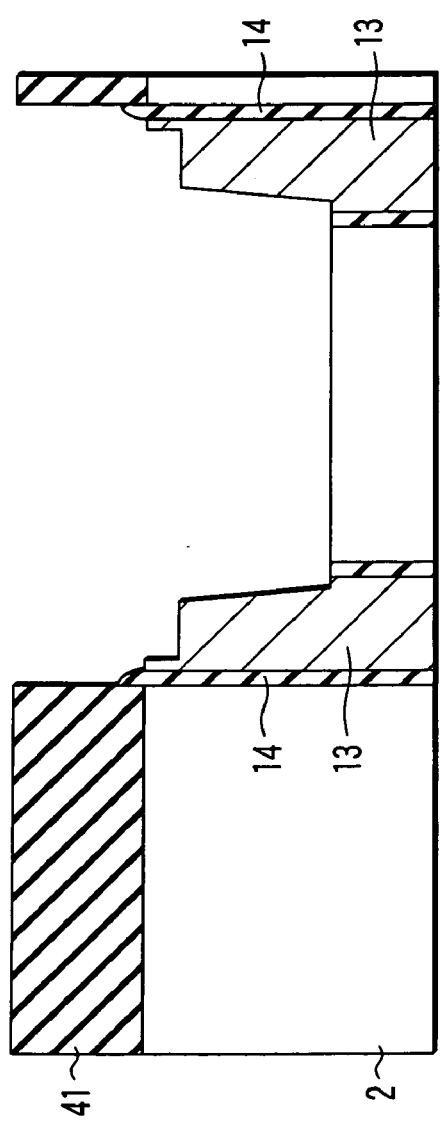
FIG. 6B
FIG. 6A

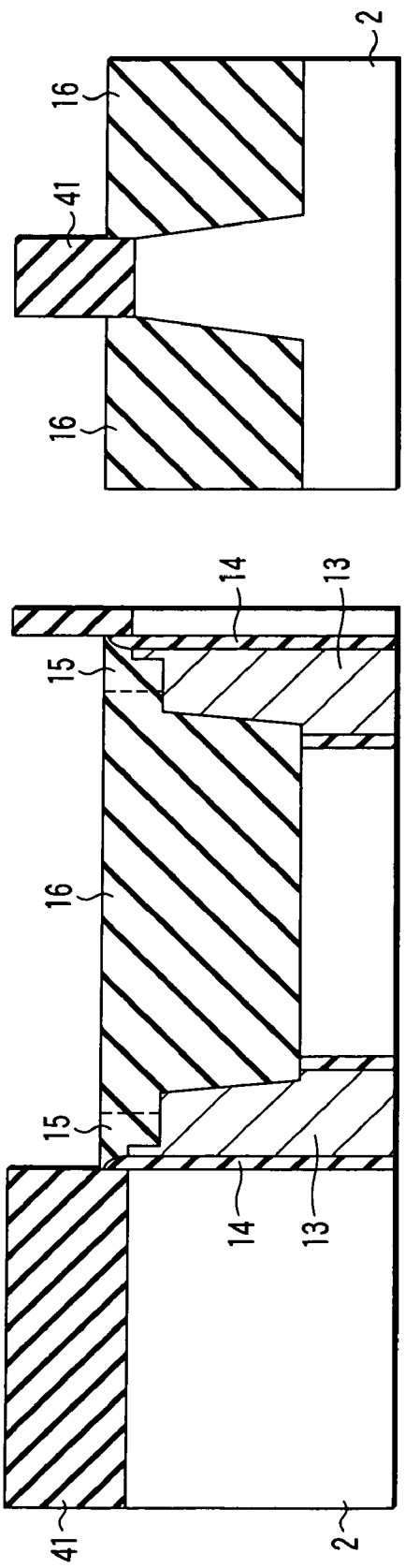

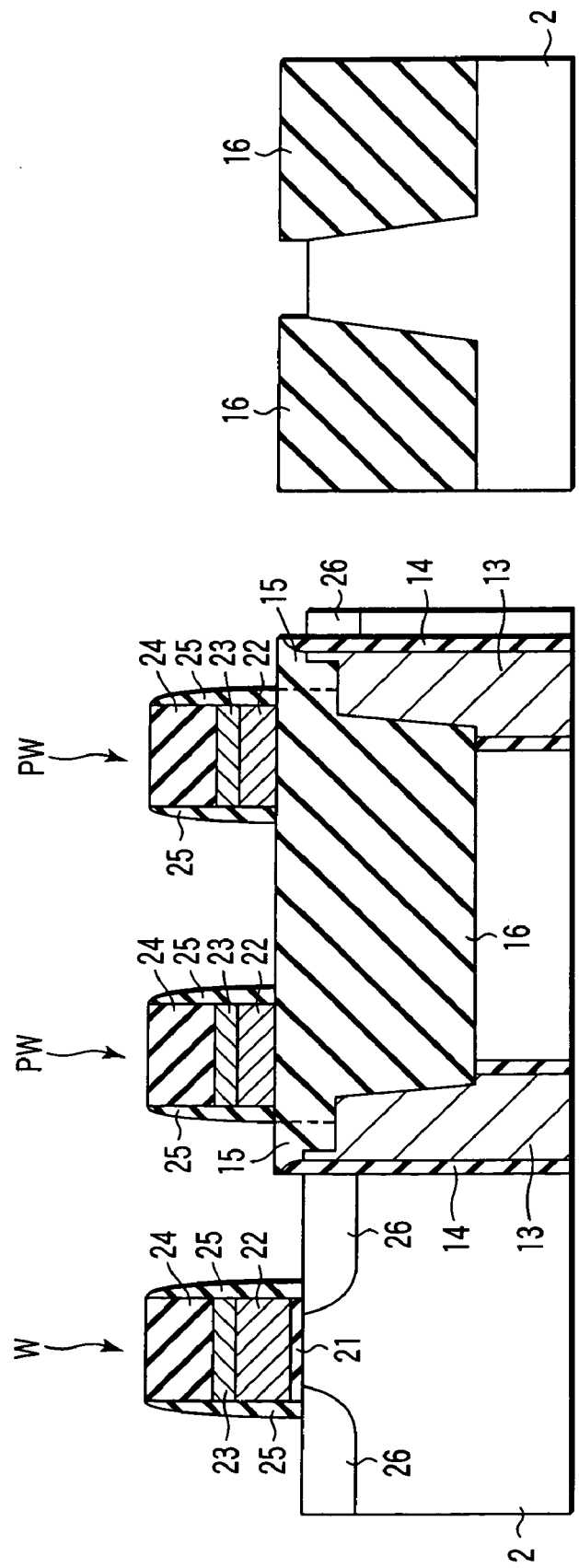

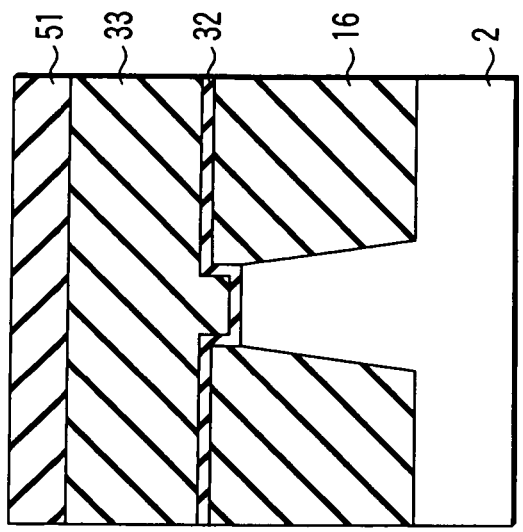
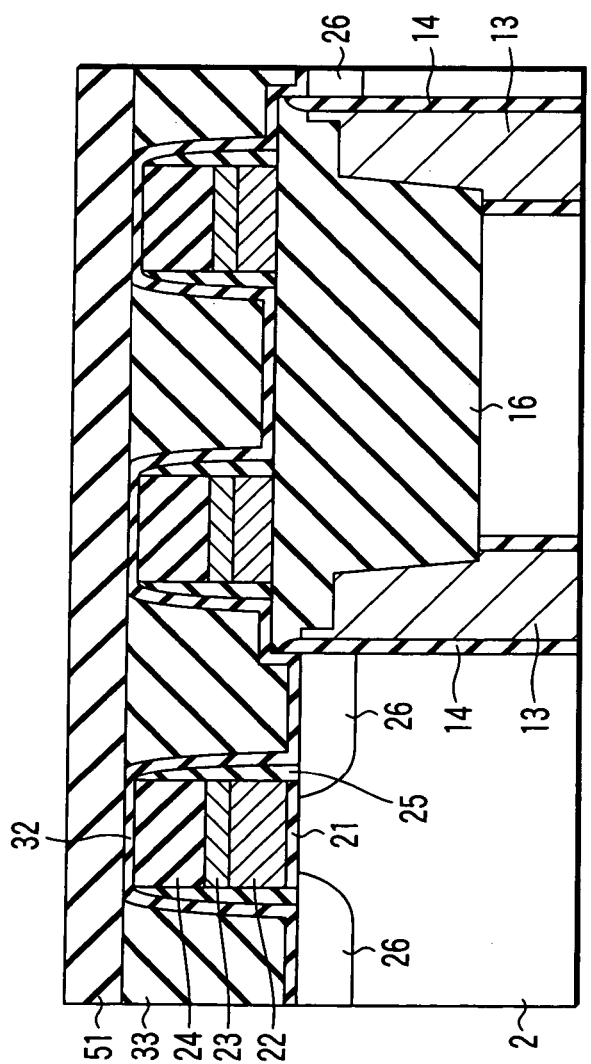
FIG. 9B
FIG. 9A

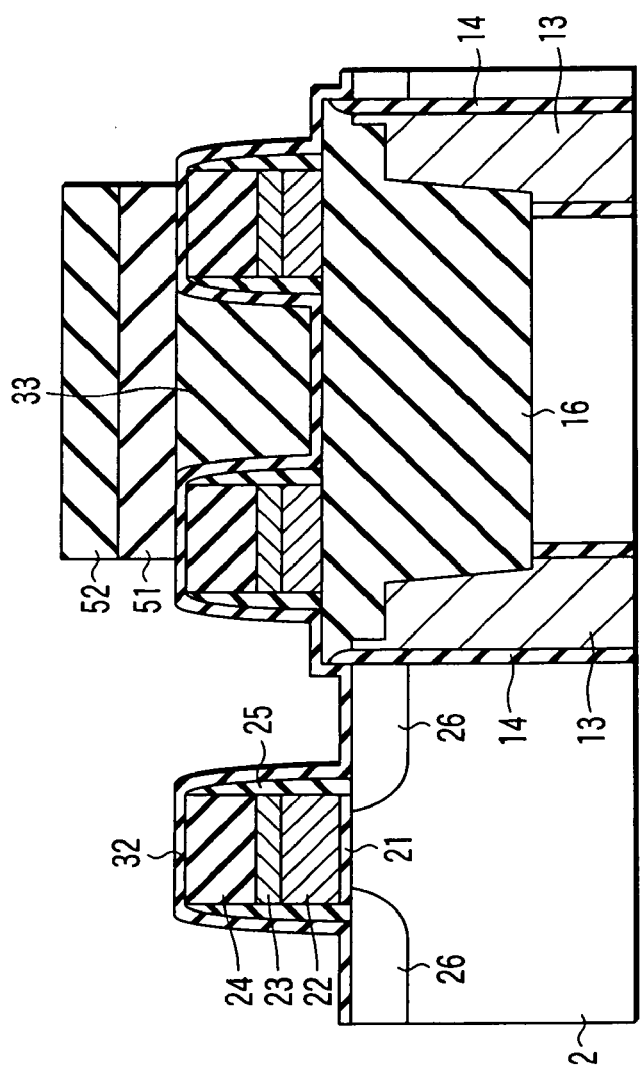
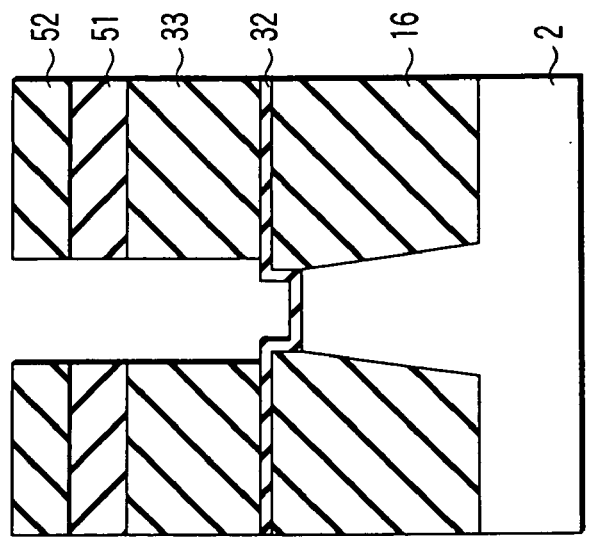
FIG. 10A
FIG. 10B

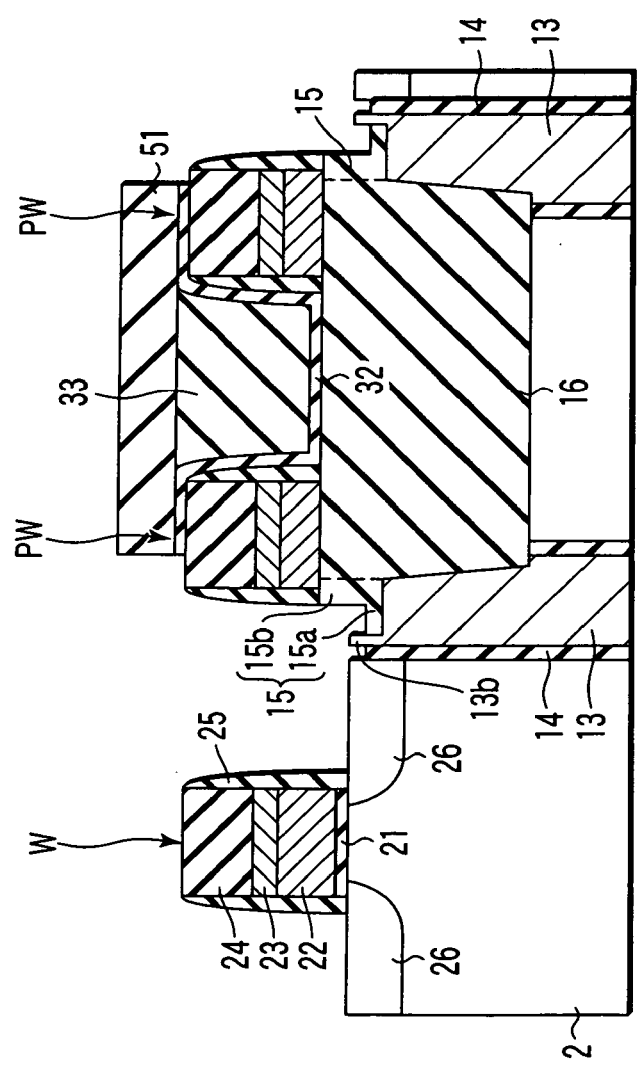
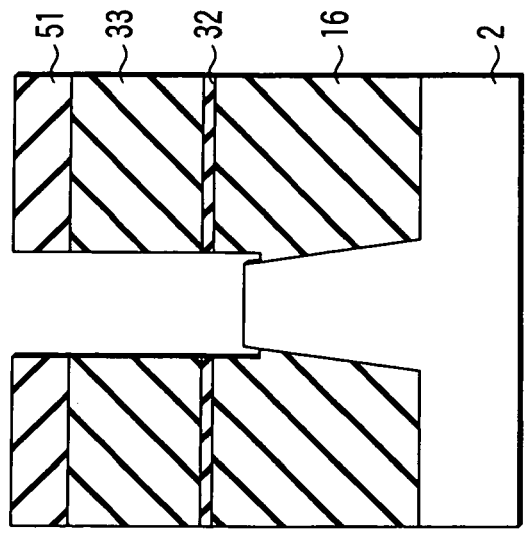
FIG. 11A
FIG. 11B

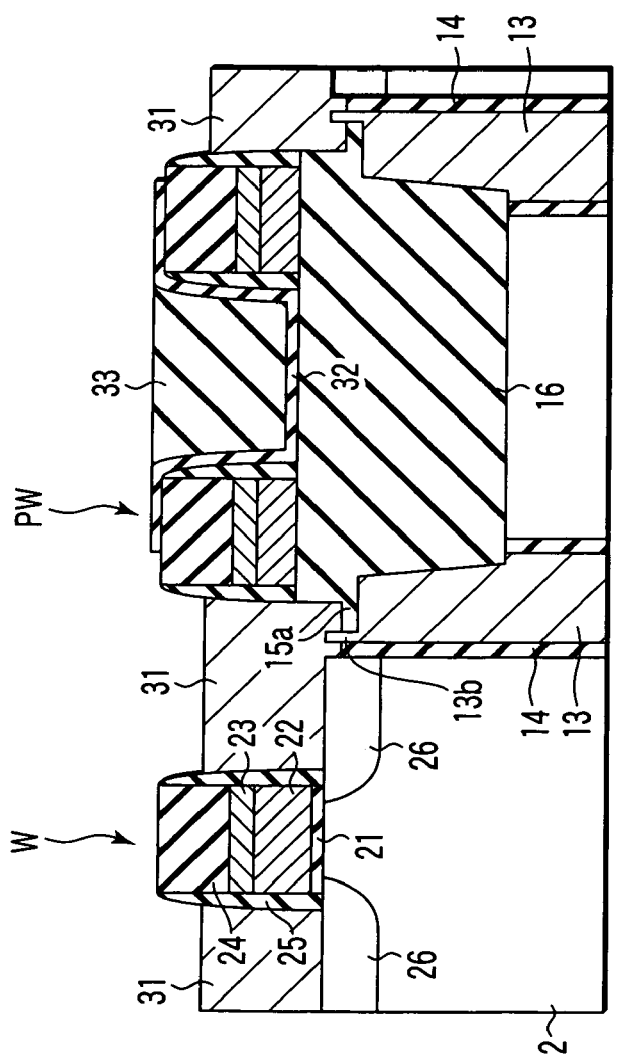
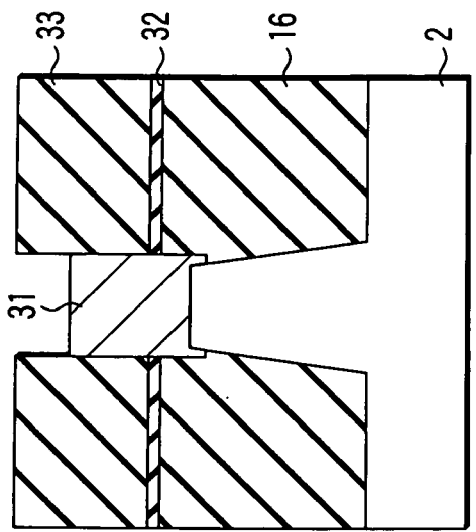
FIG. 12A
FIG. 12B

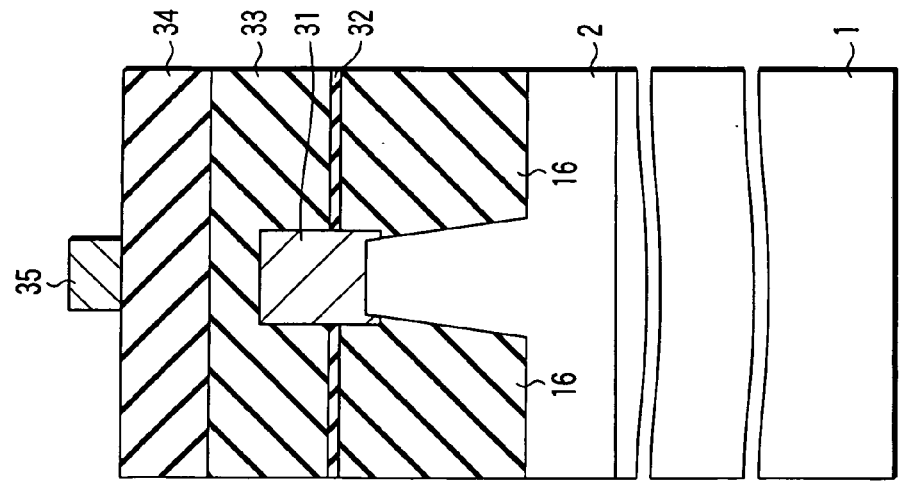
F I G. 14B
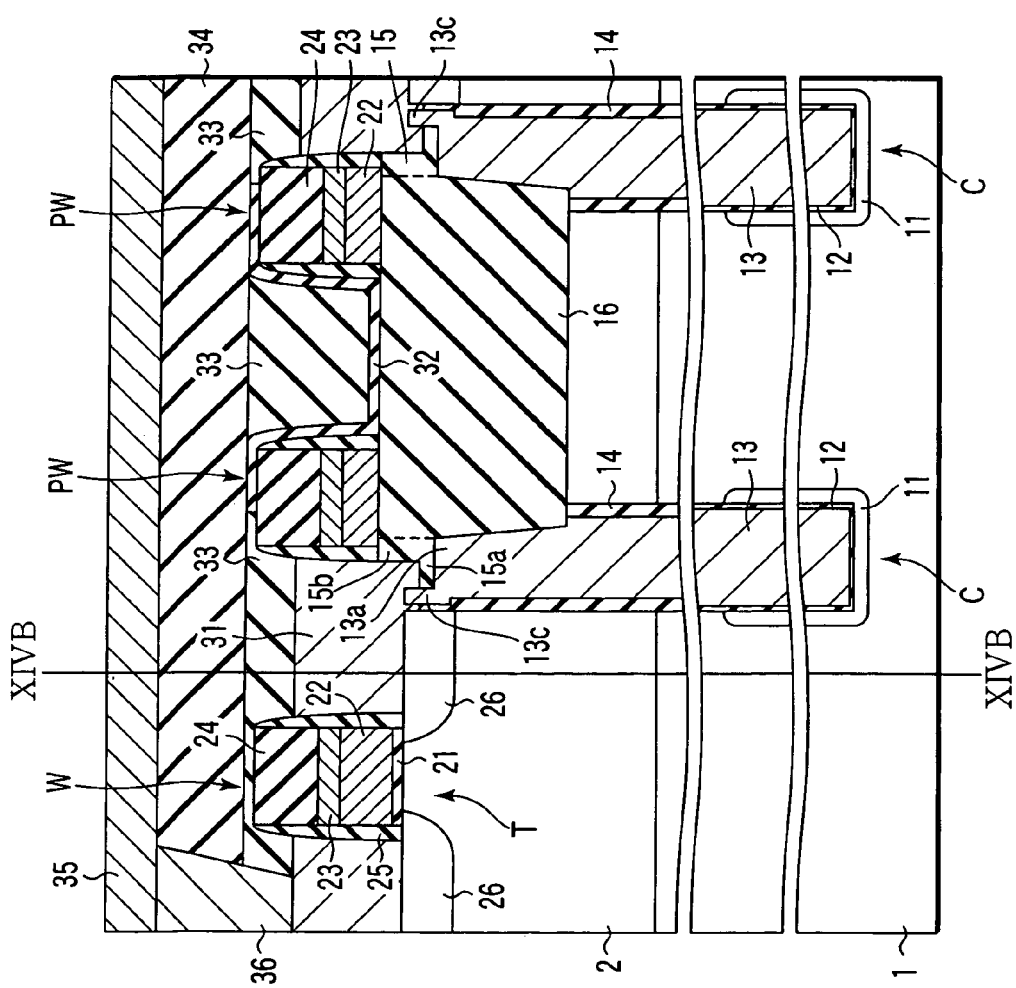
F I G. 14A

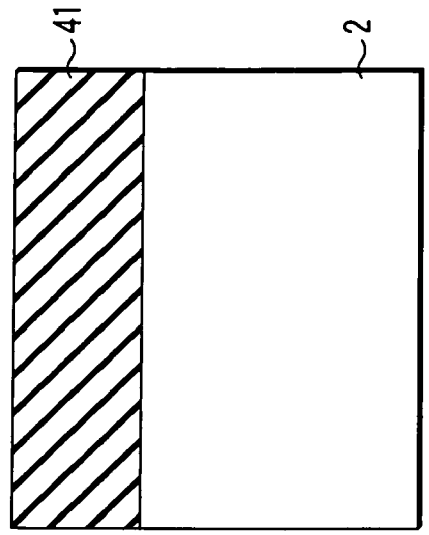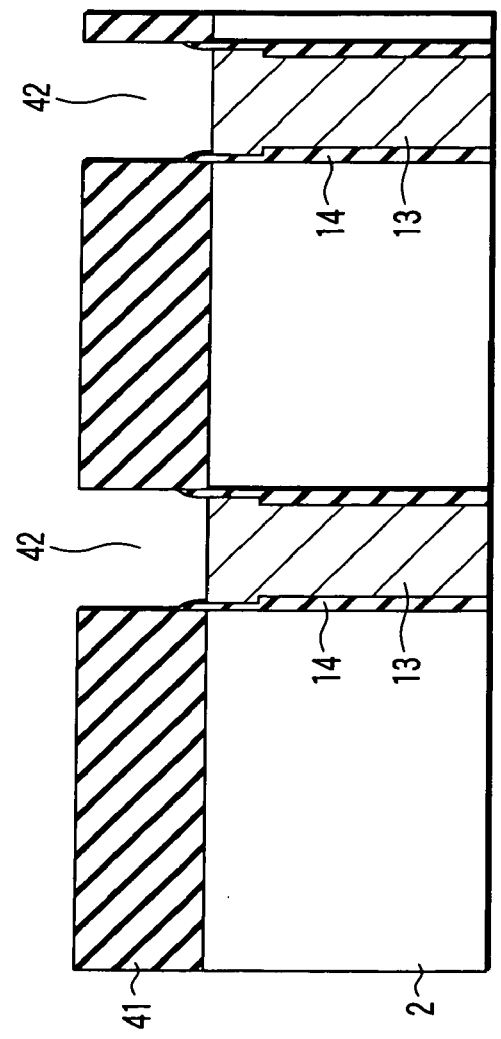

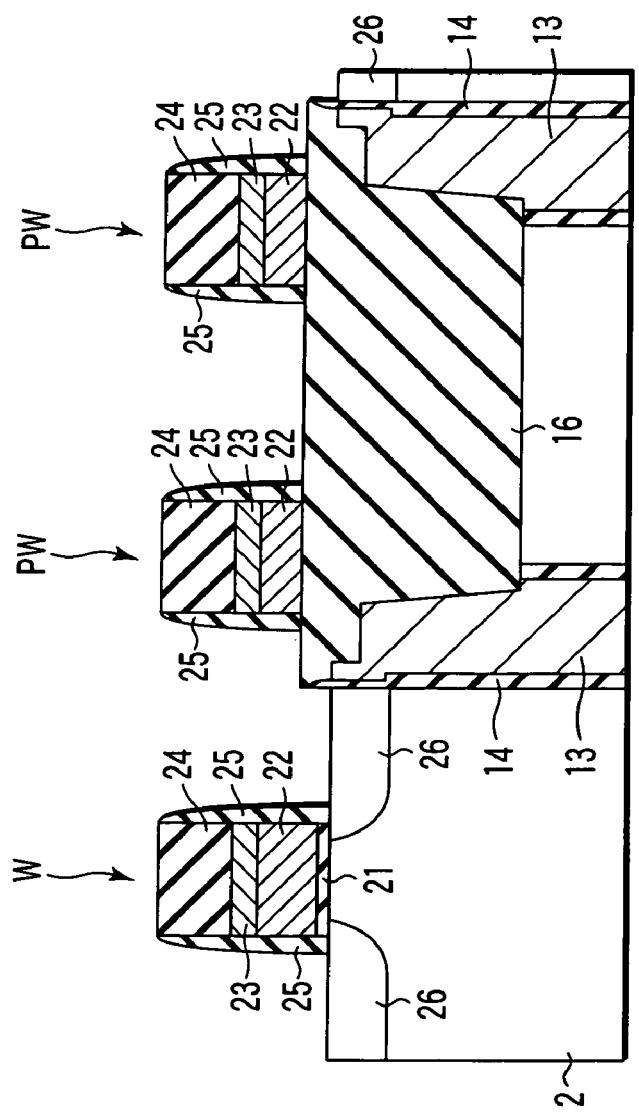
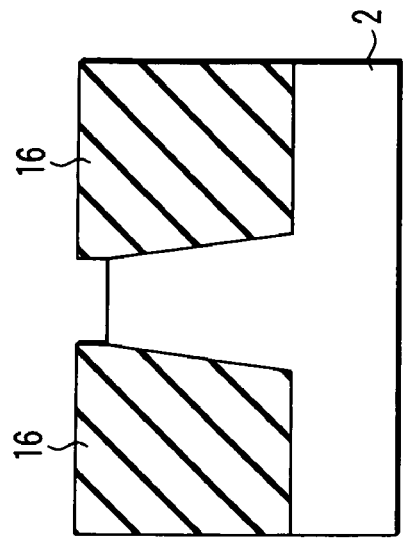
FIG. 21A
FIG. 21B

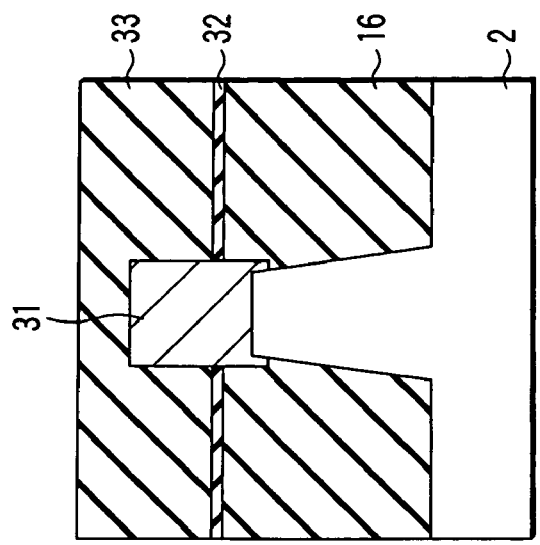
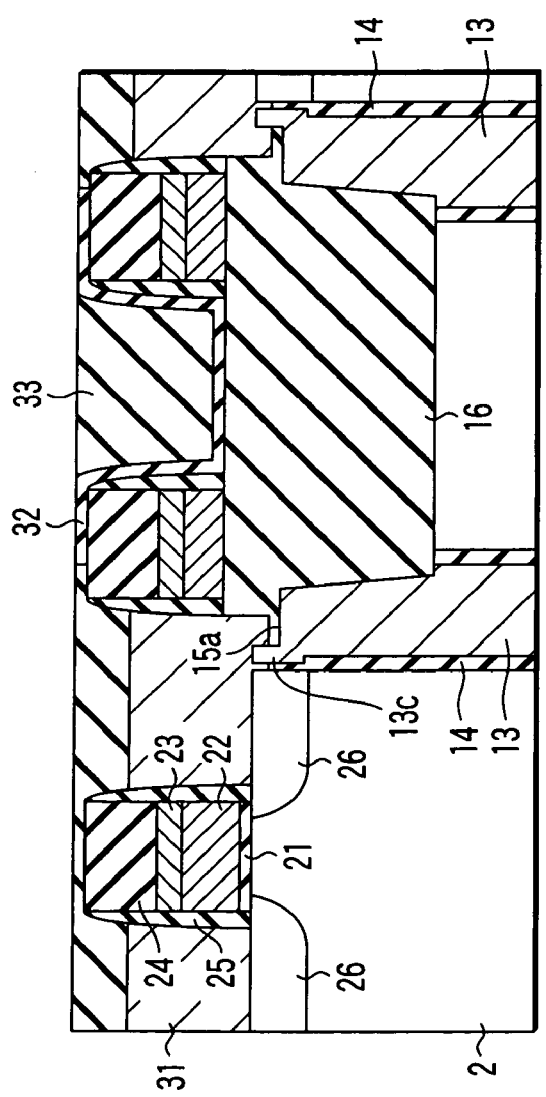
FIG. 24B
FIG. 24A

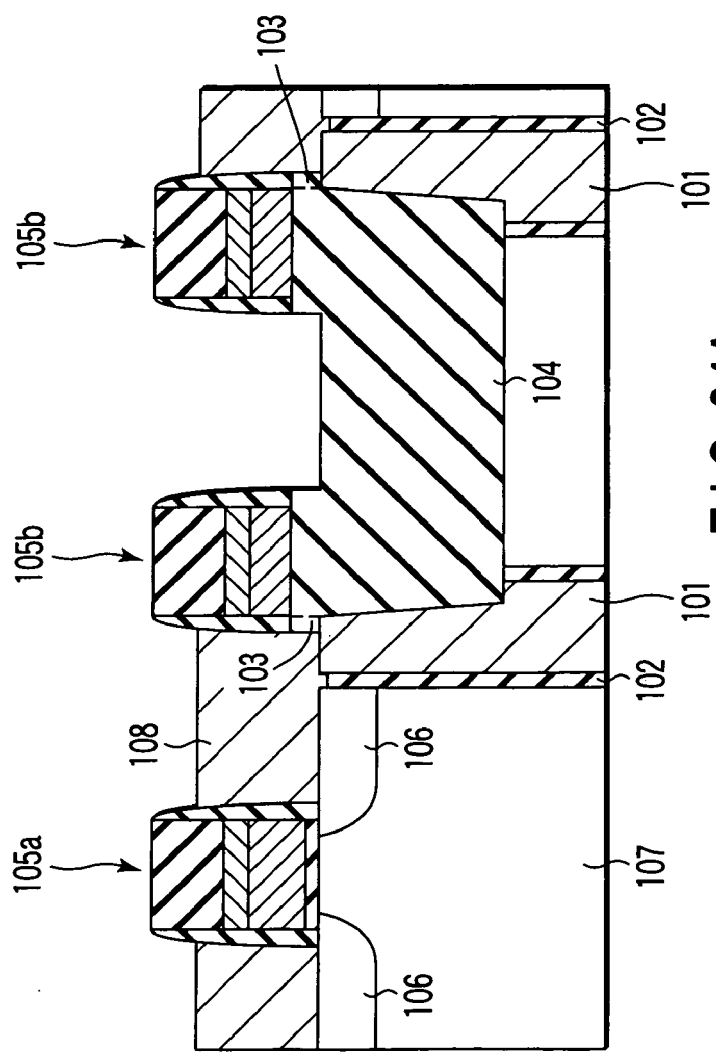
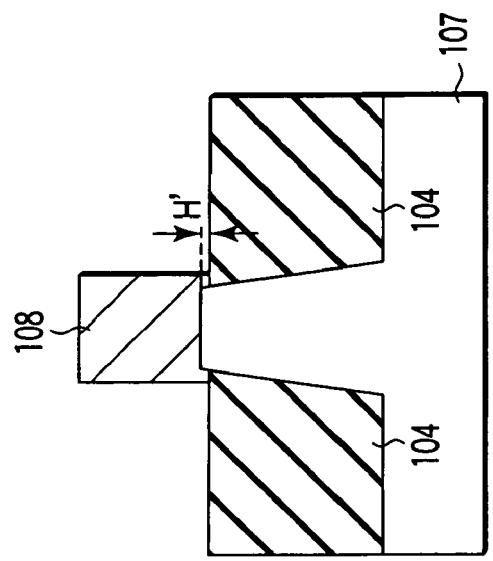
FIG. 34A
FIG. 34B

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-128071, filed Apr. 23, 2004, the entire contents of which are incorporated herein by reference.

BACKGROUND OF THE INVENTION

1. Field of the Invention

The present invention relates to a semiconductor memory device, and more particularly, for example, to a DRAM (dynamic random access memory) having a trench capacitor, and its manufacturing method.

2. Description of the Related Art

In a DRAM or a embedded DRAM device (hereinafter simply referred to as a DRAM), a surface strap (SS) type contact is known as a connection between a storage node of a capacitor formed in a deep trench (DT) and source/drain diffusion layers of a cell array transistor.

FIGS. 33A and 33B are sectional views showing part of manufacturing processes of a conventional DRAM. FIG. 33B is a sectional view taken along the line XXXIIIB—XXXIIIB in FIG. 33A and perpendicular to FIG. 33A. As shown in FIGS. 33A and 33B, there are formed a storage node 101, a collar oxide film 102, an oxide film (trench top oxide: TTO) 103 on the storage node 101, an element separation insulating film 104, a gate electrode (word line) 105a, a passing word line 105b, and source/drain diffusion layers 106. An upper surface of the storage node 101 is located slightly lower than a surface of a semiconductor substrate 107. Together with source/drain diffusion layers (not shown) formed in a section which is different from that of FIG. 33A, the passing word line 105b constitutes the cell array transistor at the position of the above section.

Next, before forming the SS type contact, the TTO film 103 needs to be removed by etching or the like in order to expose the storage node 101. When the TTO film 103 is removed, the element separation insulating film 104 is etched at the same time to largely expose a sidewall of the semiconductor substrate 107 above the element separation insulating film 104 as shown in FIG. 33B. In this state, if an SS type contact 108 such as conductive polysilicon is formed, the contact 108 contacts the sidewall of the semiconductor substrate 107, and impurities from polysilicon are diffused via this contacting portion. Due to this diffusion, a junction position of the source/drain diffusion layers 106 of the cell array transistor changes and becomes deeper than a position which has previously been formed by ion injection. This changes characteristics of the cell array transistor. This problem will be more significant as design rules become more detailed.

BRIEF SUMMARY OF THE INVENTION

According to a first aspect of the present invention, there is provided a semiconductor device comprising: a semiconductor substrate; a diffusion layer which is formed around a bottom of a trench formed in a surface of the semiconductor substrate; a first insulating film provided on an inner surface of the trench; a conductive film which is filled in the trench via the first insulating film and which has a first portion and a second portion, the second portion having an upper surface higher than that of the first portion; a second insulating film which is provided on the first portion of the conductive film and which has a first portion and a second portion, the first portion contacting the second portion of the conductive film and having an upper surface lower than the surface of the second portion of the conductive film, the second portion having an upper surface higher than the surface of the semiconductor substrate; a first gate electrode provided on the second insulating film; a second gate electrode provided above the semiconductor substrate away from the first gate electrode; source/drain diffusion layers which are formed in the surface of the semiconductor substrate and which sandwich a channel area under the second gate electrode; and a connection conductive layer extending on the conductive film and on one of the source/drain diffusion layers.

According to a second aspect of the present invention, there is provided a method of manufacturing a semiconductor device comprising: forming a diffusion layer around a bottom of a trench formed in a surface of the semiconductor substrate; forming a first insulating film on an inner surface of the trench; filling, in the trench, a conductive film which has a first portion and a second portion, the second portion having an upper surface higher than that of the first portion; forming a second insulating film which covers the first portion of the conductive film and the second portion of the conductive film; forming a first gate electrode and a second gate electrode on the second insulating film and above the semiconductor substrate, respectively; exposing the upper surface of the second portion of the conductive film; and forming a connection conductive layer covering the second portion of the conductive film and source/drain diffusion layers which are formed in the surface of the semiconductor substrate and which sandwich a channel area under the second gate electrode.

BRIEF DESCRIPTION OF THE SEVERAL VIEWS OF THE DRAWING

FIGS. 1A and 1B are diagrams showing sectional configurations of a semiconductor memory device according to a first embodiment of the present invention;

FIGS. 2A, 3A, 4A, 5A, 6A, 7A, 8A, 9A, 10A, 11A, 12A and 13A are diagrams showing, in sequence, parts of manufacturing processes of the semiconductor memory device of FIG. 1A;

FIGS. 2B, 3B, 4B, 5B, 6B, 7B, 8B, 9B, 10B, 11B, 12B and 13B are diagrams showing, in sequence, parts of manufacturing processes of the semiconductor memory device of FIG. 1B;

FIGS. 14A and 14B are diagrams showing sectional configurations of the semiconductor memory device according to a second embodiment of the present invention;

FIGS. 15A, 16A, 17A, 18A, 19A, 20A, 21A, 22A, 23A and 24A are diagrams showing, in sequence, parts of the manufacturing processes of the semiconductor memory device of FIG. 14A;

FIGS. 15B, 16B, 17B, 18B, 19B, 20B, 21B, 22B, 23B and 24B are diagrams showing, in sequence, parts of the manufacturing processes of the semiconductor memory device of FIG. 14B;

FIGS. 34A and 34B are diagrams showing the configuration of a semiconductor memory device which was devised in a development process of the present invention.

DETAILED DESCRIPTION OF THE INVENTION

Figures 33A, 33B:
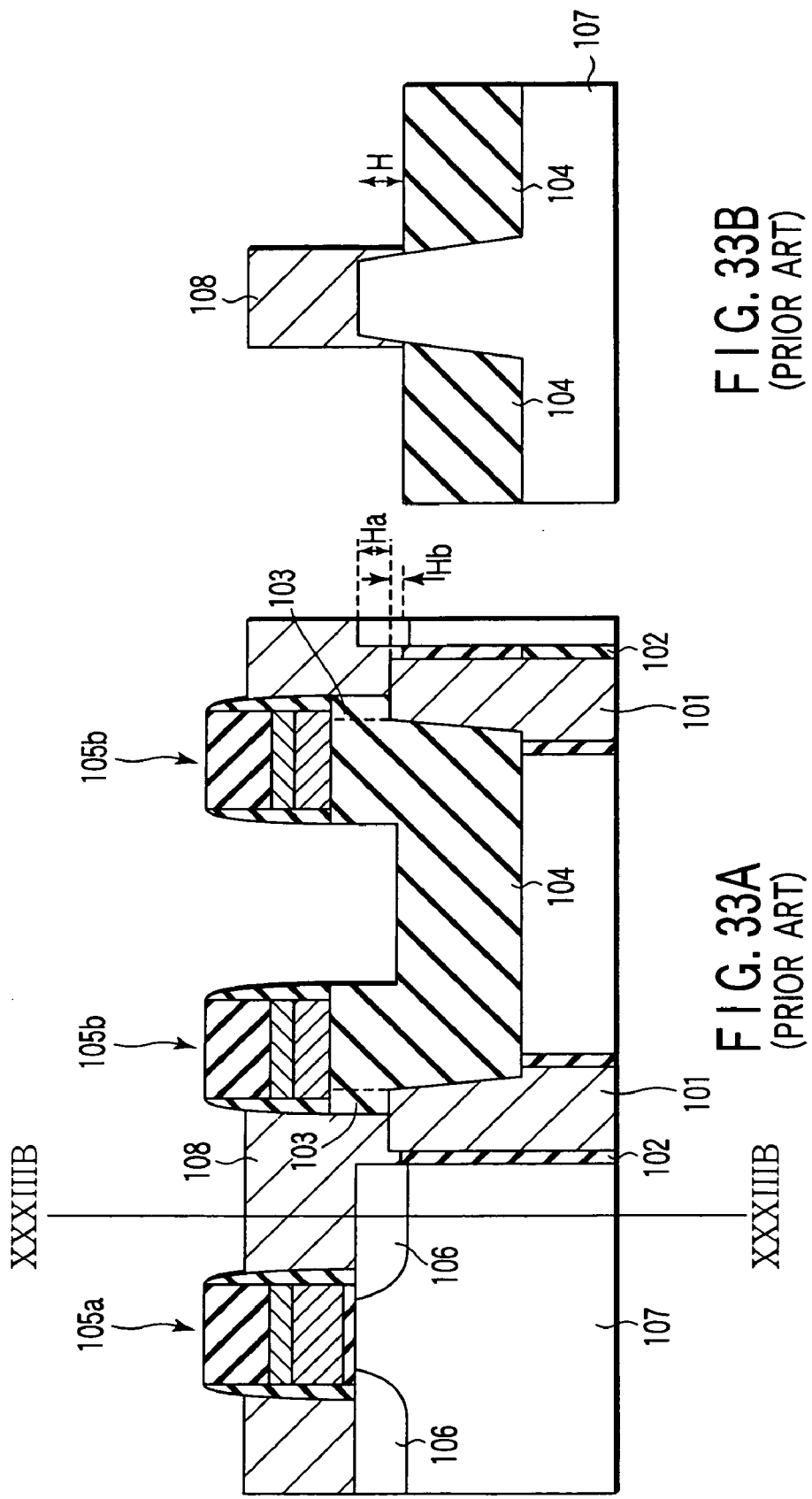
FIGS. 33A and 33B are diagrams showing sectional configurations of a conventional semiconductor memory device.

The present inventors have, in a development process of the present invention, conducted research on a DRAM in which the problems described referring to FIGS. 33A and 33B do not occur. As a result, the present inventors have obtained findings as described below.

First, a difference in height (sinking amount of an element separation insulating film) H between an upper surface of an element separation insulating film 104 and a surface of a semiconductor substrate 107 is decided by the sum of a sinking amount Ha of a storage node 101 from the surface of the semiconductor substrate 107 and a sinking amount Hb of the element separation insulating film 104 from a surface of the storage node 101. As shown in the drawing, the upper surface of the element separation insulating film 104 is located lower than an upper surface of the storage node 101. This is because a TTO film 103 is etched under a slightly overetching condition to ensure that the storage node 101 is exposed.

Reducing the amount of the sidewall of the semiconductor substrate 107 exposed on the element separation insulating film 104 is effective in reducing the above-described problem attributed to a contact 108 extensively contacting at a sidewall of the exposed semiconductor substrate 107. One method to reduce the sinking amount of the element separation insulating film 104 is to reduce the sinking amount of the storage node 101 from the surface of the semiconductor substrate 107 as shown in FIGS. 34A, 34B. As a result, the sinking amount Ha is reduced, and the sinking amount of the element separation insulating film 104 is reduced (sinking amount H') as shown in FIGS. 34A, 34B. However, the distance between the storage node 101 and a passing word line 105b is smaller than in a conventional configuration, making it more likely to cause a short circuit therebetween. As a result, a yield ratio is decreased in DRAM products, thus this method is not preferable.

Embodiments of the present invention constituted on the basis of such findings will hereinafter be described referring to the drawings. It is to be noted that in the following description, the same numerals are given to components having a similar function and configuration, and repeated descriptions are given only when necessary.

(First Embodiment)

FIGS. 1A and 1B schematically show sectional configurations of a semiconductor memory device (DRAM) according to a first embodiment of the present invention. FIG. 1B is a sectional view taken along the line IB—IB in FIG. 1A and perpendicular to FIG. 1A.

As shown in FIGS. 1A and 1B, a well 2 is formed in a surface of a semiconductor substrate 1. Trench capacitors C are formed in the surface of the semiconductor substrate 1, and a MOS (metal oxide semiconductor) transistor T is formed on the semiconductor substrate 1 (active area). The capacitor C, and the transistor T functioning as an array transistor constitute a DRAM memory cell.

The capacitor C is constituted of a diffusion layer 11 serving as a plate electrode, a capacitor insulating film 12, a storage node (conductive film) 13, a collar oxide film 14 and the like. The diffusion layer 11 is formed by diffusing n-type impurities. The collar oxide film 14 includes, for example, a silicon oxide film, and formed, in an inner surface of a trench (side surface of the semiconductor substrate 1), from an upper end of the capacitor insulating film 12 to a position slightly lower than the surface of the semiconductor substrate 1. The capacitor insulating film 12 includes, for example, a silicon nitride film. The collar oxide film 14 includes, for example, a silicon oxide film.

The storage node 13 is provided on the capacitor insulating film 12 and the collar oxide film 14 (first insulating film) inside the trench, and filled in the trench. The storage node 13 is made of, for example, amorphous silicon which is made conductive by injecting impurities such as As. The storage node 13 has a first portion 13a with an upper surface lower than the surface of the semiconductor substrate, and a second portion 13b which is located at an end portion of the storage node 13 and which has an upper surface higher than that of the first portion 13a.

The upper surface of the second portion 13b of the storage node 13 is typically located as high as the surface of the semiconductor substrate 1. A position of the upper surface of the first portion 13a is decided so that a distance between the upper surface of the first portion 13a and a passing word line PW (described later) is big enough to avoid causing a short circuit. More specifically, this distance is from 30 nm to 80 nm, preferably 50 nm to 60 nm. In consideration of these values and the distance between the surface of the semiconductor substrate 1 and the passing word line PW, the position of the upper surface of the first portion 13a of the storage node 13 is decided. For example, if the distance between the surface of the semiconductor substrate 1 and the passing word line PW is 30 nm, the distance between the surface of the semiconductor substrate 1 and the first portion 13a is 30 nm.

Furthermore, the width of the second portion 13b of the storage node 13 is set to 10 nm to 50 nm to secure a contact area between the storage node 13 and a connection conductive layer 31.

A TTO film (second insulating film) 15 including, for example, a silicon oxide film is provided on the first portion 13a of the storage node 13. The TTO film 15 has a first portion 15a in the vicinity of the second portion 13b of the storage node 13, and a second portion 15b close to the center of the storage node 13. Therefore, the thickness of the second portion 15b is the distance between the upper surface of the first portion 13a of the storage node 13 and the passing word line PW described later.

An upper surface of the first portion 15a of the TTO film is located at the same height as an upper surface of the collar oxide film 14. Here, this means that they are substantially at the same height, for example, because they are formed of a common film, or because they are planarized to have the same height, or because they are processed to have the same height through a common etching process. Therefore, this does not mean that they have completely the same height. The same is true throughout the present specification and scopes of claims. The width of the first portion 15a of the TTO film is, for example, 0 to 30 nm.

The respective upper surfaces of the collar oxide film 14 and the first portion 15a of the TTO film are located slightly lower than the upper surface of the storage node 13. This is because when part of the TTO film 15 covering the storage node 13 is removed in a certain step of a manufacturing process, it is removed under a slightly overetching condition to ensure that the second portion 13b of the storage node 13 is exposed, and at the same time the upper surface is etched back.

An element separation insulating film 16 is provided on the surface of the semiconductor substrate 1. The element separation insulating film 16 has an STI (shallow trench isolation) structure, and includes, for example, a silicon oxide film. The element separation insulating film 16 is actually formed integrally with the TTO film 15.

The passing word lines PW and a word line W extending in a vertical direction on paper in FIG. 1A are respectively formed on the element separation insulating film 16 and on the semiconductor substrate 1. The passing word line PW has a gate structure comprising the gate electrode 22 (first gate electrode), a silicide film 23 and a cap insulating film 24 that are stacked in order, and a sidewall insulating film 25 covering the sidewall of the gate structure. The word line W has a gate structure comprising a gate insulating film 21, the gate electrode 22 (second gate electrode), the silicide film 23 and the cap insulating film 24 that are stacked in order, and the sidewall insulating film 25 covering the sidewall of the gate structure. An edge of the sidewall insulating film 25 of the passing word line PW and an edge of the second portion 15b of the TTO film 15 are located on a common straight line.

The gate electrode 22 is made of, for example, polysilicon which is made conductive by introducing impurities. The silicide film 23 is made of, for example, tungsten silicide. The cap insulating film 24 includes, for example, a silicon nitride film.

The transistor T is formed by the word line W, and source/drain diffusion layers 26 formed to sandwich a channel area under the word line W. The source/drain diffusion layers 26 have an LLD (lightly doped drain) structure. It is to be noted that the source/drain diffusion layers 26 are omitted in FIG. 1B. The same applies to drawings among FIG. 2B to FIG. 32B corresponding in pairs to FIG. 2A to FIG. 32A in which the source/drain diffusion layers 26 are formed.

The surface strap type connection conductive layer 31 is filled to a predetermined height between the word line W and the passing word line PW. In other words, the conductive layer 31 extends on the semiconductor substrate 1, on the collar oxide film 14, on the second portion 13b of the storage node 13, and on the first portion 15a of the TTO film 15. The connection conductive layer 31 is made of, for example, single crystal silicon or polysilicon which has been made conductive by introducing impurities, and electrically connects the storage node 13 and the source/drain diffusion layers 26.

The connection conductive layer 31 contacts the side surface of the semiconductor substrate 1 which is exposed above the element separation insulating film 16, as shown in FIG. 1B. The height of a position where the connection conductive layer 31 faces the element separation insulating film 16 is the same as the height of the respective upper surfaces of the collar oxide film 14 and the first portion 15a of the TTO film 15. The reason for this is the same as the reason that the height of the collar oxide film 14 and the TTO film 15 is lower than the upper surface of the storage node 13.

A barrier film 32 made of an insulating material is formed on the element separation insulating film 16. The barrier film 32 includes, for example, a silicon nitride film, and has a thickness of, for example, about 8 nm. Further, the barrier film 32 covers from the sidewall insulating film 25 of the passing word line PW on the side of the adjacent passing word line PW to about three quarters of the cap insulating film 24.

An interlayer insulating film 33 made of, for example, BPSG (borophosphosilicate glass) is formed on the connection conductive layer 31 and on the barrier film 32. An interlayer insulating film 34 which is made of, for example, TEOS (tetraethoxy silane) and which has a thickness of, for example, about 150 nm is formed on the barrier film 32 and the interlayer insulating film 33. A metal wiring layer 35 having a predetermined pattern is formed on the interlayer insulating film 34. The metal wiring layer 35 is connected to a contact 36 which penetrates the interlayer insulating films 33 and 34 to reach the connection conductive layer 31.

Next, a method of manufacturing the semiconductor memory device of FIGS. 1A and 1B will be described below referring to FIGS. 2A and 2B to FIGS. 13A and 13B. FIGS. 2A, 3A, 4A, 5A, 6A, 7A, 8A, 9A, 10A, 11A, 12A and 13A show, in sequence, parts of manufacturing processes of the configuration of FIG. 1A. FIGS. 2B, 3B, 4B, 5B, 6B, 7B, 8B, 9B, 10B, 11B, 12B and 13B show, in sequence, parts of the manufacturing processes of the configuration of FIG. 1B. It is to be noted that FIGS. 4A to 13A, FIGS. 4B to 13B only show parts above the well 2.

As shown in FIGS. 2A and 2B, the well 2 is formed in the surface of the semiconductor substrate 1 by ion injection. Next, a pad insulating film of about 222 nm is formed on the entire surface on the semiconductor substrate 1. A pad insulating film 41 is constituted of, for example, a stacked silicon oxide film of about 2 nm and a silicon nitride film of about 220 nm. Next, a mask material (not shown) having an opening in an area where the capacitor C is expected to be formed is formed on the pad insulating film 41. Then, using this mask material, a trench 42 is formed in the pad insulating film 41 and the semiconductor substrate 1 by anisotropic etching such as RIE (reactive ion etching).

Next, after the mask material is removed, an n-type conductive material (not shown) is filled in an area deeper than, for example, 1.5 μm from the surface in the trench 42. As a result, a diffusion layer of n-type impurities is formed in the vicinity of the bottom of the trench 42. Subsequently, the material in the trench is removed.

Next, as shown in FIGS. 3A and 3B, the capacitor insulating film 12 and the collar oxide film 14 are formed on an inner surface of the trench 42. The upper surface of the collar oxide film 14 is located slightly higher than the surface of the semiconductor substrate 1. Next, a material film (amorphous silicon into which As is injected) of the storage node 13 is filled into the trench 42 via the collar oxide film 14. The filled storage node 13 has a height which the second portion 13b of the storage node should have, and typically has a height as high as the surface of the semiconductor substrate 1.

The process of FIGS. 3A and 3B can also be achieved by, for example, the following processes. More specifically, the capacitor insulating film 12 having a thickness of about 5 nm is first deposited on a bottom surface and side surfaces of the trench 42. Next, the material film of the storage node 13 is filled into the trench 42, and then this material film is etched back to a depth of about 1.3 µm from the surface of the semiconductor substrate 1 by, for example, the RIE. The capacitor insulating film 12 which is exposed at the sidewall of the trench 42 due to the etch back is removed. Next, a silicon oxide film of about 6 µm is formed by, for example, a thermal oxidation, on the sidewall of the trench 42 from which the capacitor insulating film 12 has been removed. Subsequently, a silicon oxide film is deposited on the above silicon oxide film, and then the bottom is removed by, for example, the RIE to form the collar oxide film 14. Next, the material film of the storage node 13 is further filled into the trench 42 to the same height as the surface of the semiconductor substrate 1. The above processes make it possible to obtain the same state as in FIGS. 3A, 3B.

Figures 4A, 4B:
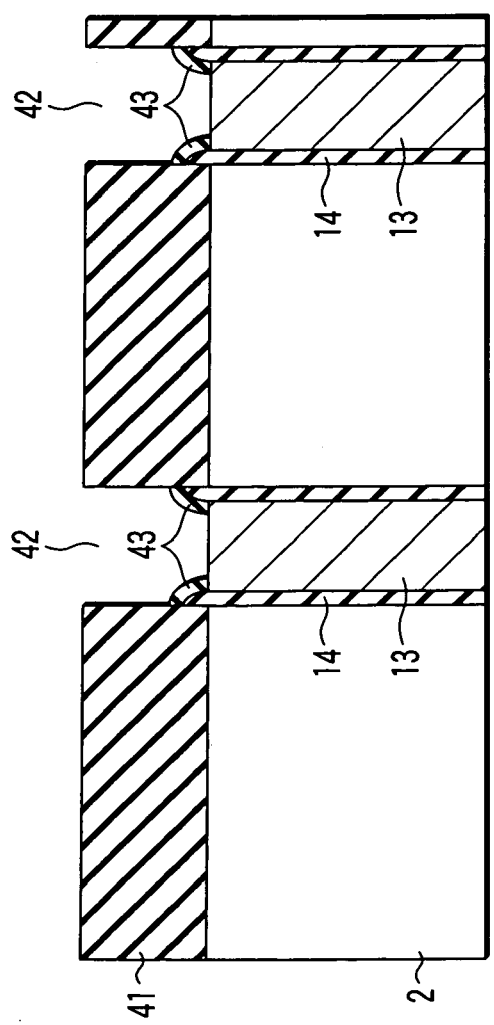

Next, as shown in FIGS. 4A and 4B, a spacer 43 made of, for example, BSG (boron silicate glass) is formed to cover the collar oxide film 14 exposed in the trench 42. More specifically, a BSG film of, for example, about 50 nm is first deposited on the sidewall of the trench 42, on the collar oxide film 14 and on the storage node 13. Next, the BSG film on the sidewall of the pad insulating film 41 and on the storage node 13 is removed by, for example, the RIE.

Next, as shown in FIGS. 5A and 5B, the storage node 13 is etched back with the spacer 43 as a mask such that a concave portion is formed in an upper portion of the storage node 13. A bottom of this concave portion will be the first portion 13a of the storage node 13, and a protrusion will be the second portion 13b.

Next, as shown in FIGS. 6A and 6B, the spacer 43 is removed, and then the pad insulating film 41 in an area where the element separation insulating film 16 is formed is removed. Subsequently, the semiconductor substrate 1, the storage node 13, the collar oxide film 14 and the like in a position where the element separation insulating film 16 is formed are removed in a lithography process and by etching such as the RIE, thereby forming the trench.

Next, as shown in FIGS. 7A and 7B, a material film of the element separation insulating film 16 is deposited on the entire surface on the semiconductor substrate 1 and is etched back to the position where an upper surface of the element separation insulating film 16 is to be positioned. As a result, the element separation insulating film 16 and the TTO film 15 are formed.

Next, as shown in FIGS. 8A and 8B, the word line W, the passing word line PW and the source/drain diffusion layers 26 are formed. In other words, a material film of the gate insulating film 21 is formed by, for example, the thermal oxidation method, on the entire surface of the semiconductor substrate 1. Next, material films of the gate electrode 22, the silicide film 23 and the cap insulating film 24 are deposited on the entire surface on the semiconductor substrate 1 by, for example, a CVD (chemical vapor deposition) method. Next, each of the material films is patterned into the gate structure by a lithography process and an anisotropic etching, such as the RIE. Next, a source/drain extension layer (not shown) is formed by ion injection with the gate structure as a mask. Next, a material film of the sidewall insulating film 25 is deposited on the entire surface on the semiconductor substrate 1 and is then etched to form the sidewall insulating film 25. Subsequently, the source/drain diffusion layers 26 are formed by ion injection with the sidewall insulating film 25 and the gate structure as a mask.

Next, as shown in FIGS. 9A and 9B, the barrier film 32 is deposited on the entire surface on the semiconductor substrate 1. Then, the interlayer insulating film 33 is deposited on the barrier film 32. The interlayer insulating film 33 is planarized to the same height as the barrier film 32 on the gate structure. Subsequently, a mask material 51 made of, for example, TEOS is formed on the entire surface on the semiconductor substrate 1.

Next, as shown in FIGS. 10A and 10B, a mask material 52 including, for example, a photoresist film is formed on the mask material 51. The mask material 52 has an opening corresponding to an area where the connection conductive layer 31 is formed. Next, the mask material 51 is etched in the RIE or the like using the mask material 52. Then, part of the interlayer insulating film 33 is removed by etching, by an RIE for example, using the mask material 51.

Next, as shown in FIGS. 11A and 11B, after the mask material 52 is removed, part of the barrier film 32 is removed by etching, by an RIE for example, using the mask material 51. Then, part of the TTO film 15 is removed by etching, by an RIE for example, using the mask material 51, the word line W and the passing word line PW. The etching in this case is set under a slightly overetching condition to ensure that the second portion 13b of the storage node 13 is exposed. In other words, if, for example, a thickness from an upper surface of the TTO film 15 to the second portion 13b of the storage node 13 is 100%, the condition is such that the TTO film 15 having a thickness of 120% to 150% is removed. As a result, the upper surface of the first portion 15a of the TTO film 15 is retreated to a height below the surface of the semiconductor substrate 1. However, the thickness of the TTO film 15 to be removed until the second portion 13b of the storage node 13 is exposed is smaller than in a conventional configuration of the semiconductor memory device. Therefore, even under the slightly overetching condition, the amount of the side surface of the semiconductor substrate 1 exposed on the element separation insulating film 16 is significantly reduced as compared with the conventional configuration. As a result of etching, the collar oxide film 14 is also retreated to the same height as the first portion 15a of the TTO film 15.

Next, as shown in FIGS. 12A and 12B, a material film of the connection conductive layer 31 is deposited on the entire surface on the semiconductor substrate 1 and etched back to a position slightly lower than an upper end of the gate structure. As a result, the connection conductive layer 31 is formed on the semiconductor substrate 1 between the word line W and the passing word line PW. In this process, the connection conductive layer 31 contacts the side surface of the semiconductor substrate 1 exposed above the element separation insulating film 16. However, the height of this contact area is about the same as a distance between the upper surface of the second portion 13b of the storage node 13 (the surface of the semiconductor substrate 1) and the upper surface of the first portion 15a of the TTO film 15, which is smaller than in the conventional configuration.

Figure 13B:
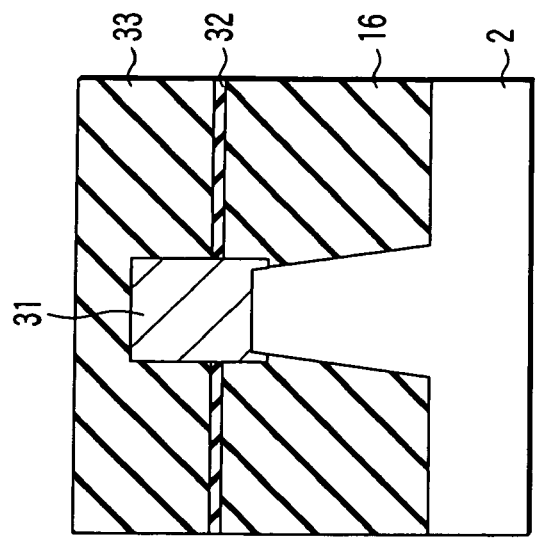
Figure 13A:
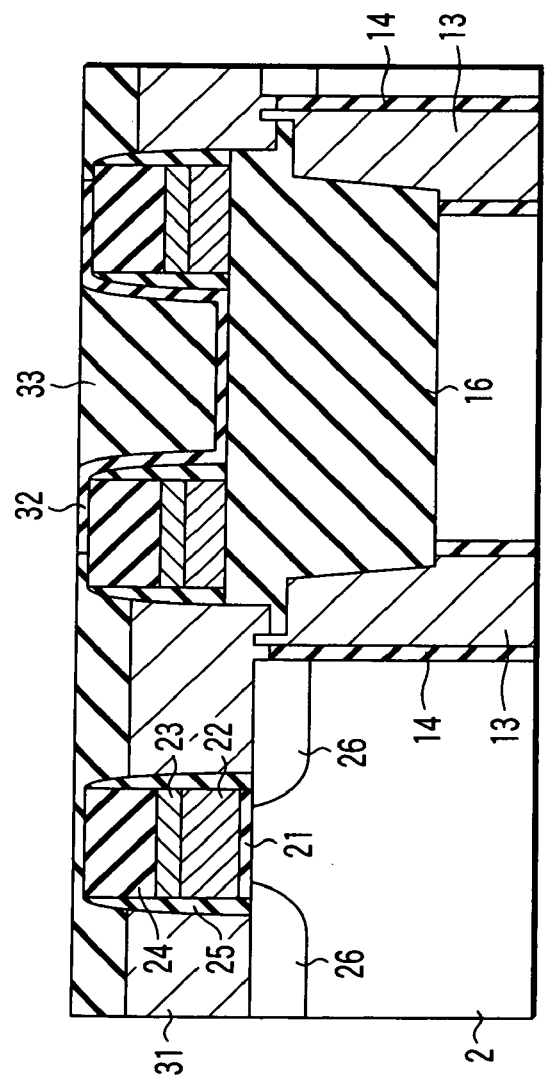

Next, as shown in FIGS. 13A and 13B, a material film of the interlayer insulating film 33 is deposited on the entire surface on the semiconductor substrate 1 to the same height as the barrier film 32. As a result, the interlayer insulating film 33 is formed also on the connection conductive layer 31.

Next, as shown in FIGS. 1A and 1B, the interlayer insulating film 34 is deposited on the interlayer insulating film 33. Subsequently, the contact 36 which penetrates the interlayer insulating films 33 and 34 to reach the connection conductive layer 31 is formed, and the metal wiring layer 35 is formed on the interlayer insulating film 34.

In the semiconductor memory device according to the first embodiment, the storage node 13 has the first portion 13a, and the second portion 13b having the upper surface higher than the upper surface of the first portion 13a. Therefore, the positions of the first portion 13a and the second portion 13b can be independently set. The upper surface of the second portion 13b is set to a position such that the amount of the TTO film 15 to be etched to ensure that the second portion 13b is exposed will be small. If the upper surface of the second portion 13b is set at about the same height as the surface of the semiconductor substrate 1, the upper surface of the element separation insulating film 16 which is etched at the same time as the TTO film 15 can be prevented from being located significantly lower than the surface of the semiconductor substrate 1. Therefore, the area where the side surface of the semiconductor substrate 1 exposed by etching the element separation insulating film 16 contacts the connection conductive layer 31 is reduced. As a result, it is possible to prevent a junction of the source/drain diffusion layers 26 from changing into a deep position due to impurities diffused from the connection conductive layer 31.

On the other hand, the upper surface of the first portion 13a is set to have a sufficient distance from the gate electrode 22 on the TTO film 15. Therefore, it is possible to avoid a short circuit caused by the storage node 13 and the gate electrode 22 on the TTO film 15.

As described above, according to the first embodiment, it is possible to provide the semiconductor memory device which can avoid a short circuit caused by the storage node 13 and the gate electrode 22 of the passing word line PW, and can prevent the position of the junction of the source/drain diffusion layers 26 from changing.

(Second Embodiment)

In a second embodiment, a second portion 13c of the storage node 13 is formed with a thickness larger than that of the second portion 13b of the first embodiment. FIGS. 14A, 14B schematically show sectional configurations of the semiconductor memory device according to the second embodiment of the present invention. FIG. 14B is a sectional view taken along the line XIVB—XIVB in FIG. 14A and perpendicular to FIG. 14A.

As shown in FIGS. 14A and 14B, the second portion 13c of the storage node 13 protrudes more toward the side of the source/drain diffusion layers 26 and is thicker than the second portion 13b of the first embodiment. An amount of thickened portion of the second portion 13c of the storage node 13 is as about the same as that of the thinned portion of the collar oxide film 14

Next, the method of manufacturing the semiconductor memory device of FIGS. 14A and 14B will be described below referring to FIGS. 15A and 15B to FIGS. 24A and 24B. FIGS. 15A, 16A, 17A, 18A, 19A, 20A, 21A, 22A, 23A and 24A show, in sequence, parts of manufacturing processes of the configuration of FIG. 14A. FIGS. 15B, 16B, 17B, 18B, 19B, 20B, 21B, 22B, 23B and 24B show, in sequence, parts of the manufacturing processes of the configuration of FIG. 14B. It is to be noted that FIG. 15A to FIG. 24A, FIG. 15B to FIG. 24B only show parts above the well 2.

Figure 15B:
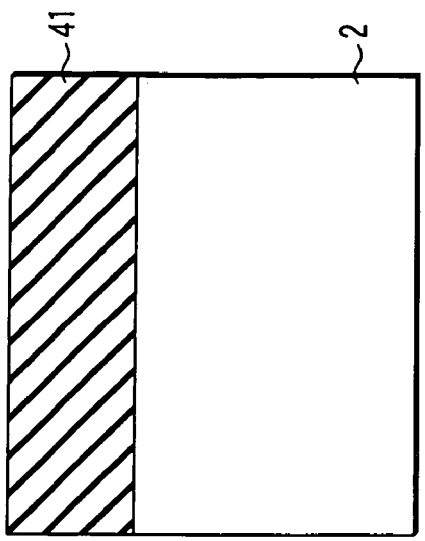
Figure 15A:
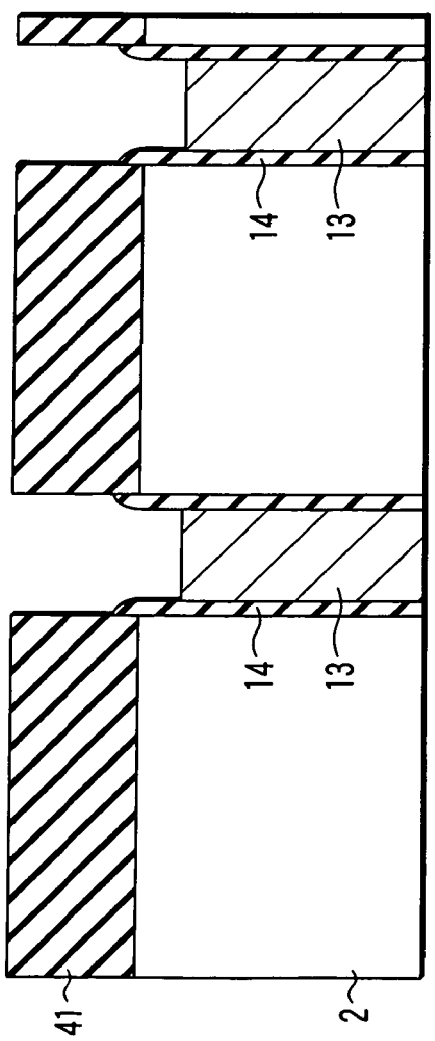

First, the same processes as the processes up to FIGS. 3A and 3B of the first embodiment are performed. Next, as shown in FIGS. 15A, 15B, the upper surface of the storage node 13 is etched back to, for example, a position about 60 nm lower than the surface of the semiconductor substrate 1.

Figure 16B:
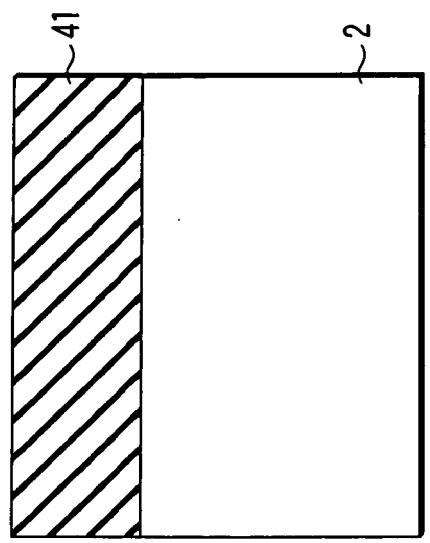
Figure 16A:
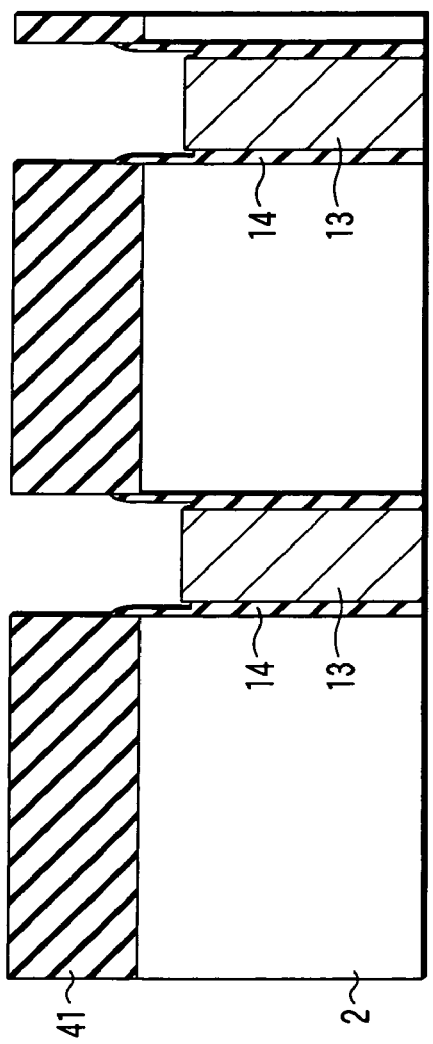

Next, as shown in FIGS. 16A and 16B, the thickness of the exposed collar oxide film 14 is reduced to a thickness of, for example, about 10 nm by, for example, wet etching using a hydrofluoric acid-based chemical.

Next, as shown in FIGS. 17A and 17B, the material film of the storage node 13 is again filled into the trench 42 and etched back to the same height as the surface of the semiconductor substrate 1.

Figure 18A:
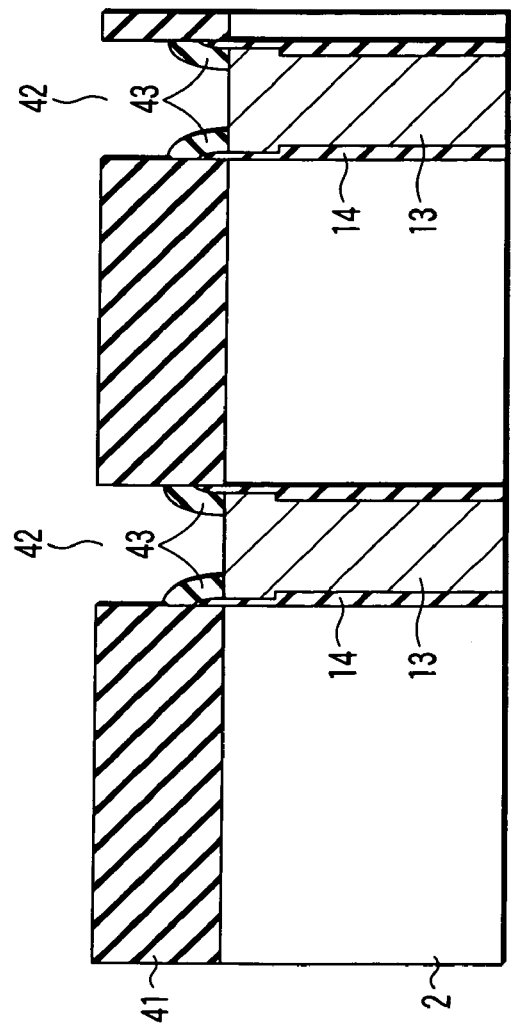
Figure 18B:
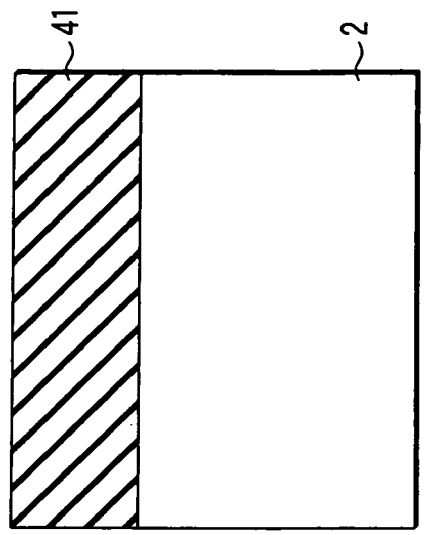

Next, as shown in FIGS. 18A and 18B, the spacer 43 is formed on the sidewall of the trench 42, on the collar oxide film 14 and on the storage node 13 through the same process as in FIG. 4A, FIG. 4B.

Figures 19A, 19B:
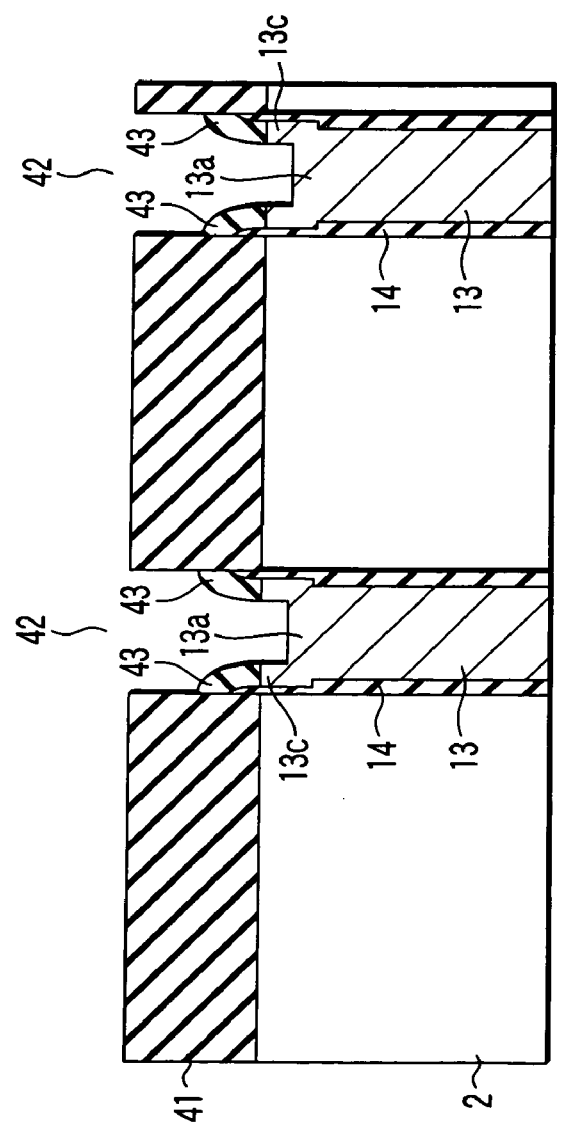

Next, as shown in FIGS. 19A and 19B, a concave portion is formed in the upper portion of the storage node 13 through the same process as in FIGS. 5A, 5B.

Figure 20B:
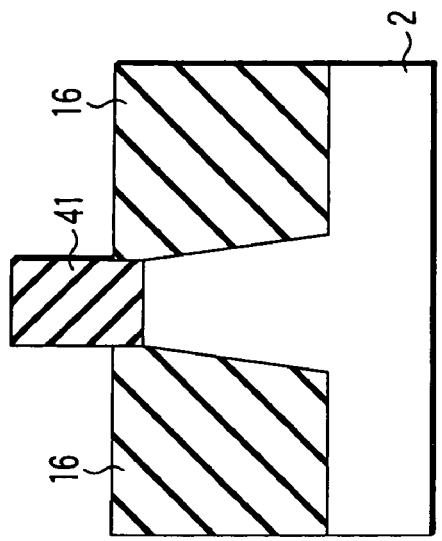
Figure 20A:
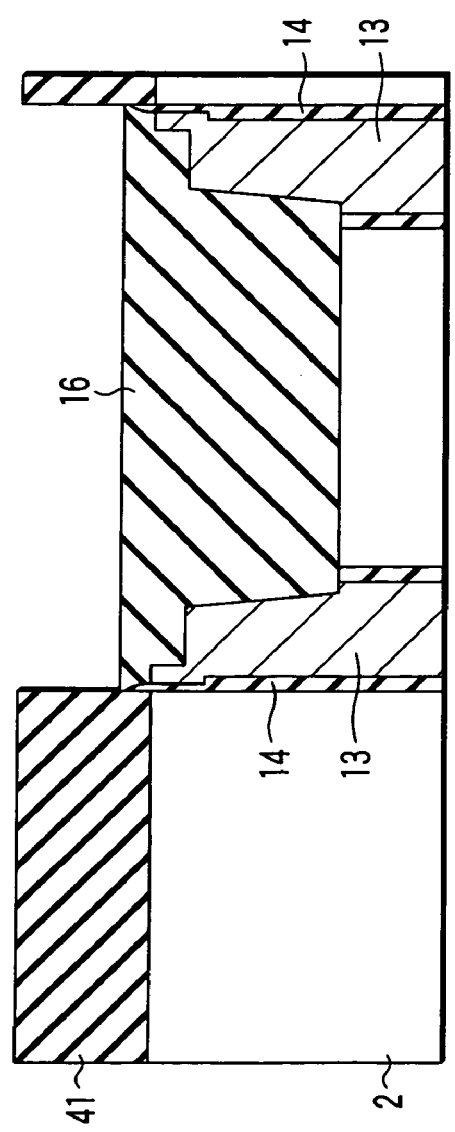

Next, as shown in FIGS. 20A and 20B, the element separation insulating film 16 is formed through the same processes as in FIGS. 6A, 6B, and FIGS. 7A, 7B.

Next, as shown in FIGS. 21A and 21B, the word line W, the passing word line PW and the source/drain diffusion layers 26 are formed through the same process as in FIGS. 8A, 8B.

Figure 22B:
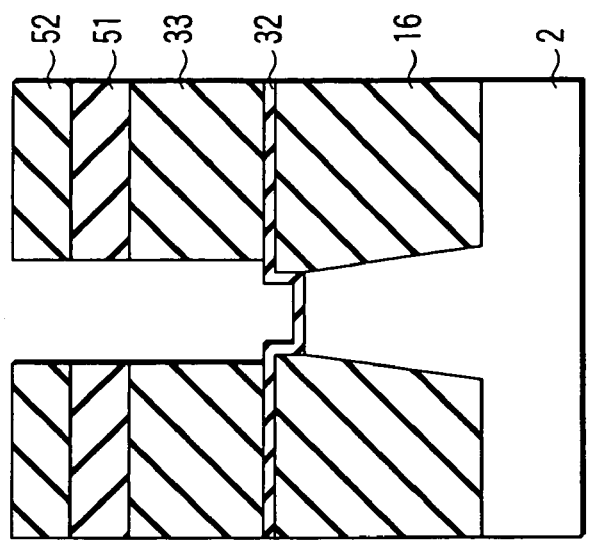
Figure 22A:
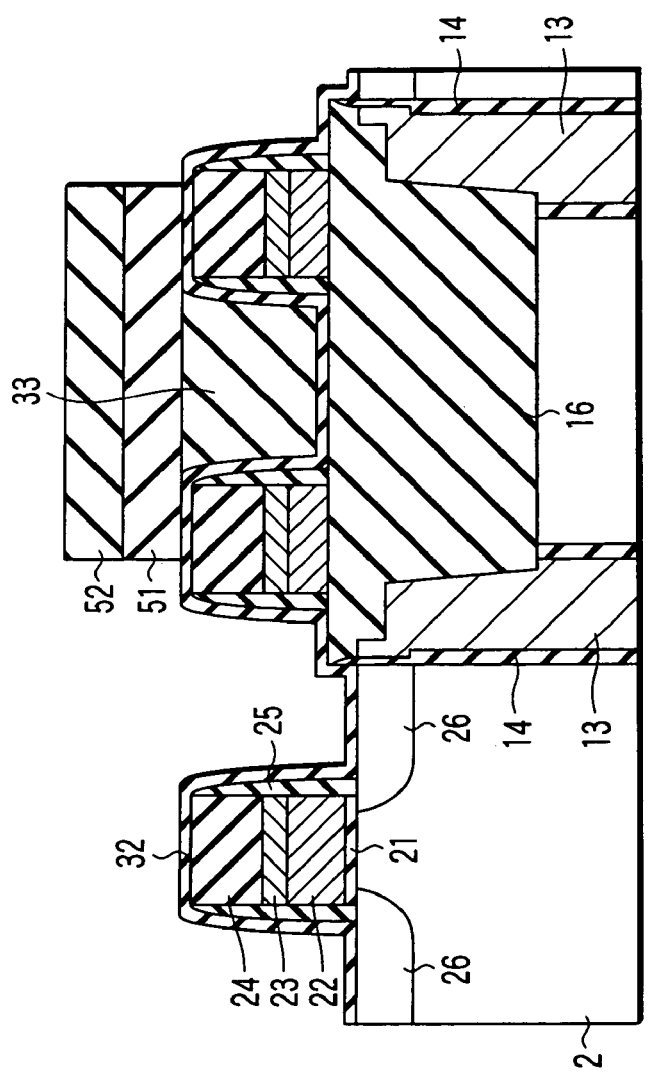

Next, as shown in FIGS. 22A and 22B, the barrier film 32, the interlayer insulating film 33 and the mask material 51 are deposited on the entire surface on the semiconductor substrate 1 through the same processes as in FIGS. 9A, 9B, and FIGS. 10A, 10B. Then, the mask material 52 is formed which has an opening in an area where the connection conductive layer 31 is formed. Subsequently, the mask material 51 and part of the interlayer insulating film 33 are removed by use of the mask material 52.

Figure 23B:
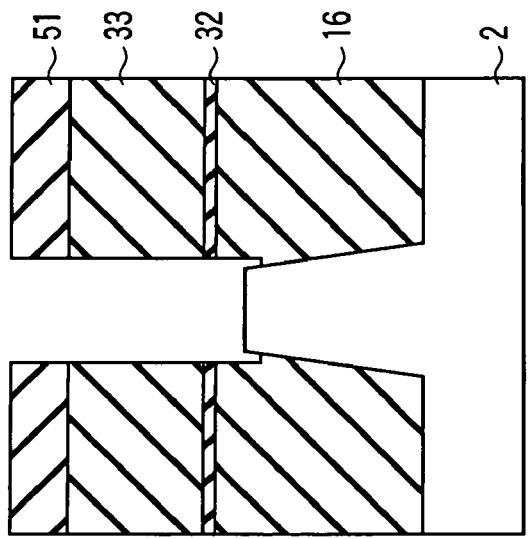
Figure 23A:
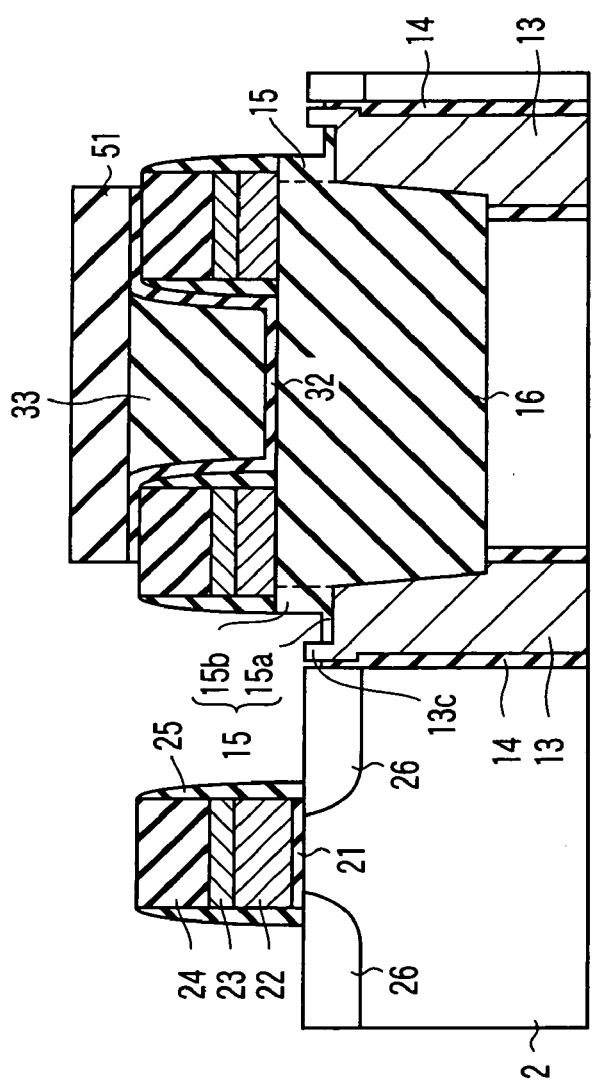

Next, as shown in FIGS. 23A and 23B, part of the barrier film 32 and part of the interlayer insulating film 33 (the TTO film 15) are removed by use of the mask material 51 after the mask material 52 is removed, through the same process as in FIGS. 11A, 11B. As a result, the second portion 13c of the storage node 13 is exposed. This process is also performed under the slightly overetching condition, and the respective upper surfaces of the element separation insulating film 16, the first portion 15a of the TTO film 15 and the collar oxide film 14 are retreated to a height below the surface of the semiconductor substrate 1.

Next, as shown in FIGS. 24A and 24B, the connection conductive layer 31 is formed on the semiconductor substrate 1 between the word line W and the passing word line PW through the same processes as in FIGS. 12A, 12B, and FIGS. 13A, 13B. Next, the interlayer insulating film 33 is formed on the connection conductive layer 31.

Next, as shown in FIGS. 14A and 14B, the interlayer insulating film 33, the interlayer insulating film 34, the contact 36 and the metal wiring layer 35 are formed through the same process as in FIG. 1A, FIG. 1B.

In the semiconductor memory device according to the second embodiment, the storage node 13 has the first portion 13a and the second portion 13c having an upper surface higher than the upper surface of the first portion, as in the first embodiment. Therefore, the same effects as in the first embodiment can be obtained.

Furthermore, according to the second embodiment, the second portion 13c of the storage node 13 has a width larger than the second portion 13b of the storage node 13 of the first embodiment. Therefore, a larger area where the storage node 13 and the connection conductive layer 31 contact can be secured than in the first embodiment. Thus, a resistance value in the contact portion can be reduced.

(Third Embodiment)

A third embodiment differs from the first embodiment in the method of manufacturing the semiconductor memory device and therefore in the configuration of several additional parts.

Figure 25B:
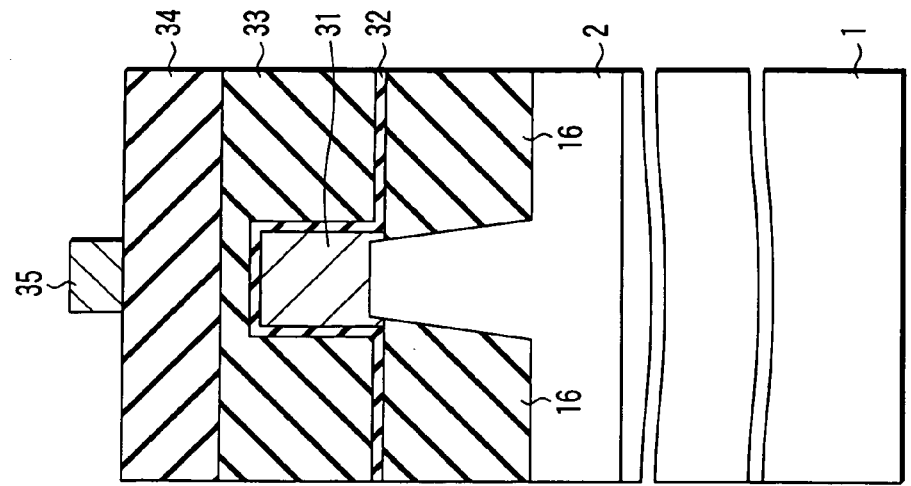
FIGS. 25A and 25B are diagrams showing sectional configurations of the semiconductor memory device according to a third embodiment of the present invention.
Figure 25A:
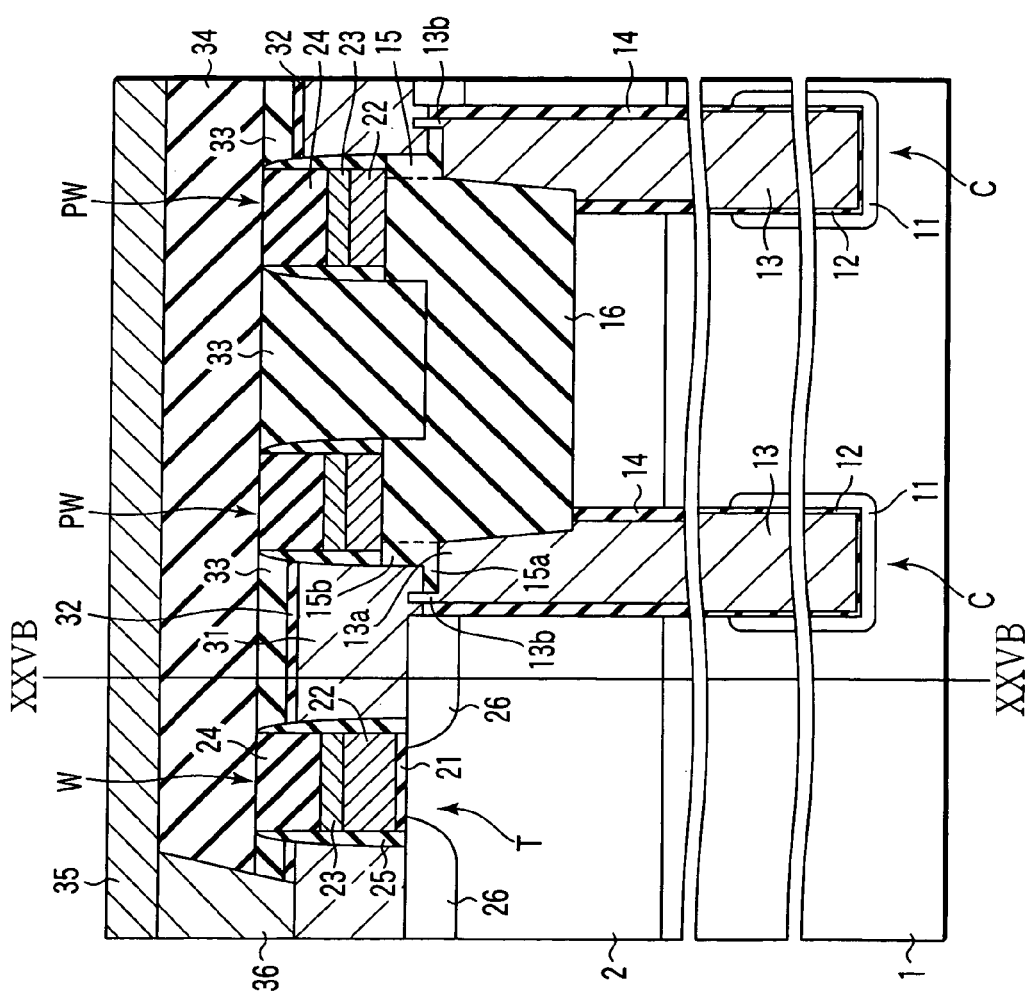

FIGS. 25A, 25B schematically show sectional configurations of the semiconductor memory device according to the third embodiment of the present invention. FIG. 25B is a sectional view taken along the line XXVB—XXVB in FIG. 25A and perpendicular to FIG. 25A.

As shown in FIGS. 25A and 25B, the barrier film 32 covers the upper surface and side surfaces of the connection conductive layer 31. The upper surface of the element separation insulating film 16 between the passing word lines PW has a concave shape, and the height of a bottom surface of this concave portion is as high as the first portion 15a of the TTO film 15. The interlayer insulating film 33 is formed to the upper surface of the gate structure in the concave portion of the element separation insulating film 16, between the passing word lines PW, and on the connection conductive layer 31. In the section of FIG. 25B, the upper surface of the element separation insulating film 16 has the same height as the first portion 15a of the TTO film 15 (or the bottom surface of the concave portion of the element separation insulating film 16). The area in which the connection conductive layer 31 contacts the side surface of the semiconductor substrate 1 exposed above the element separation insulating film 16 is the same as in the first embodiment. The storage node 13 has the same shape as in the first embodiment.

Figure 26A:
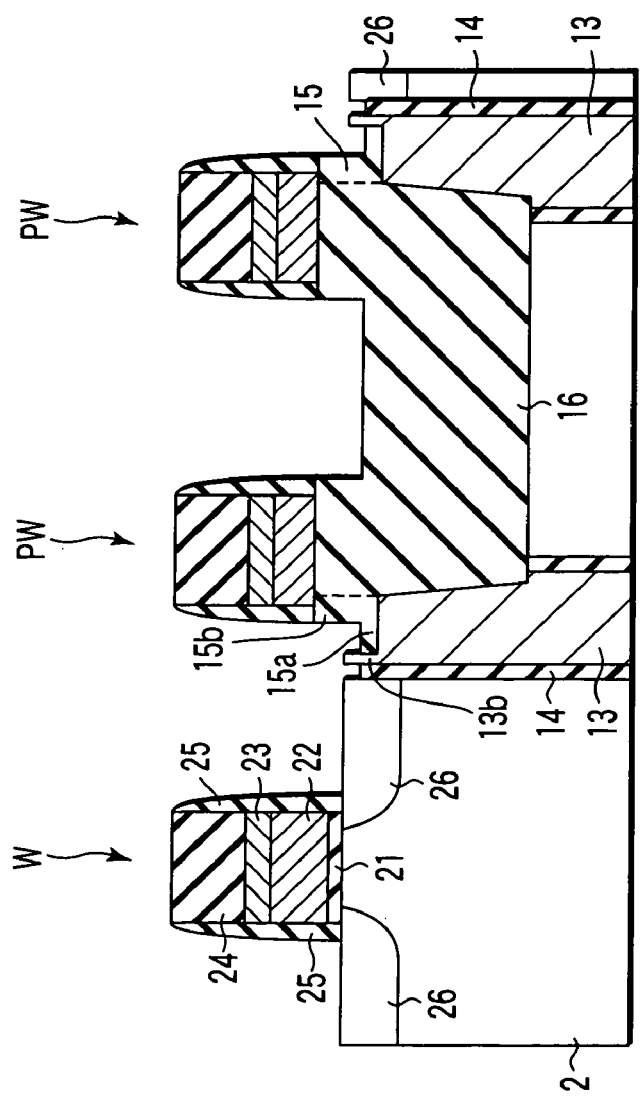
FIGS. 26A, 27A and 28A are diagrams showing, in sequence, parts of the manufacturing processes of the semiconductor memory device of FIG. 25A.
Figure 26B:
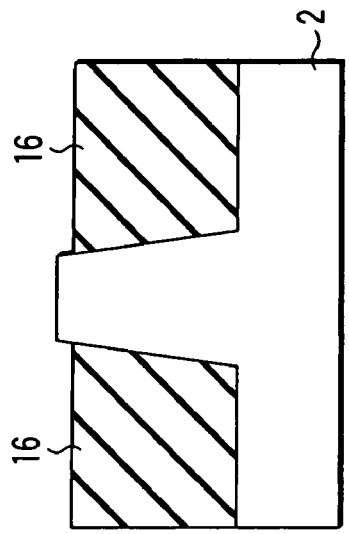
FIGS. 26B, 27B and 28B are diagrams showing, in sequence, parts of the manufacturing processes of the semiconductor memory device of FIG. 25B.
Figure 27B:
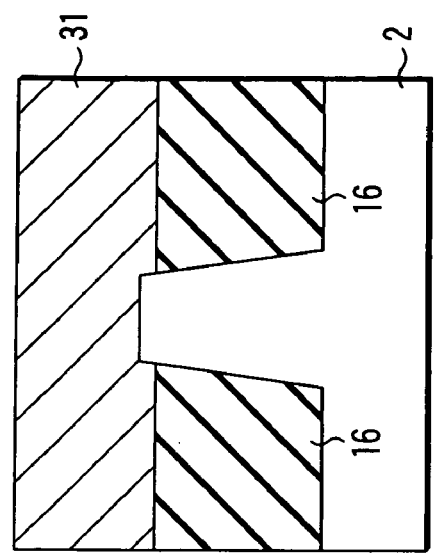
Figure 27A:
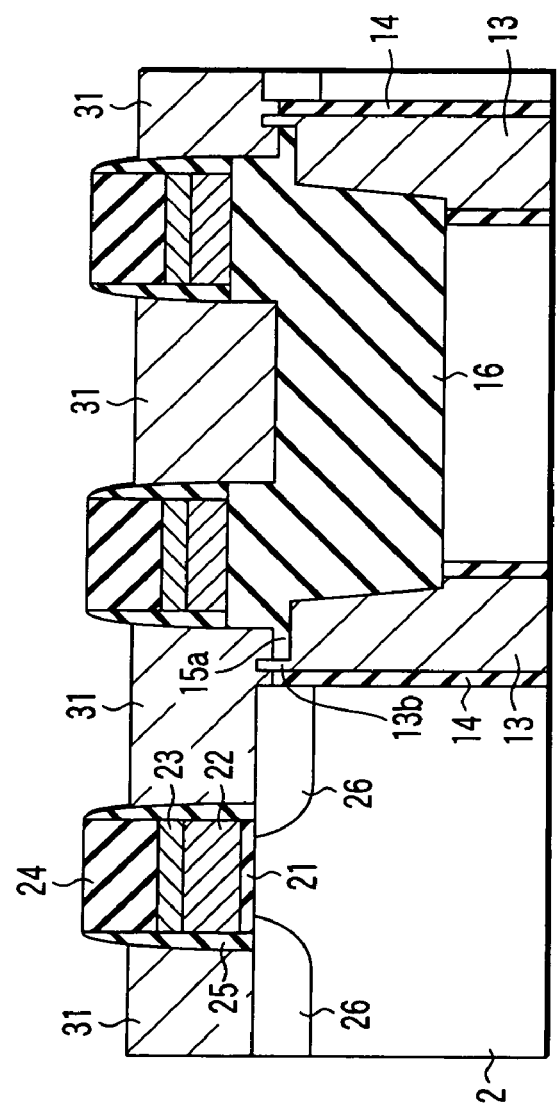
Figures 28A, 28B:
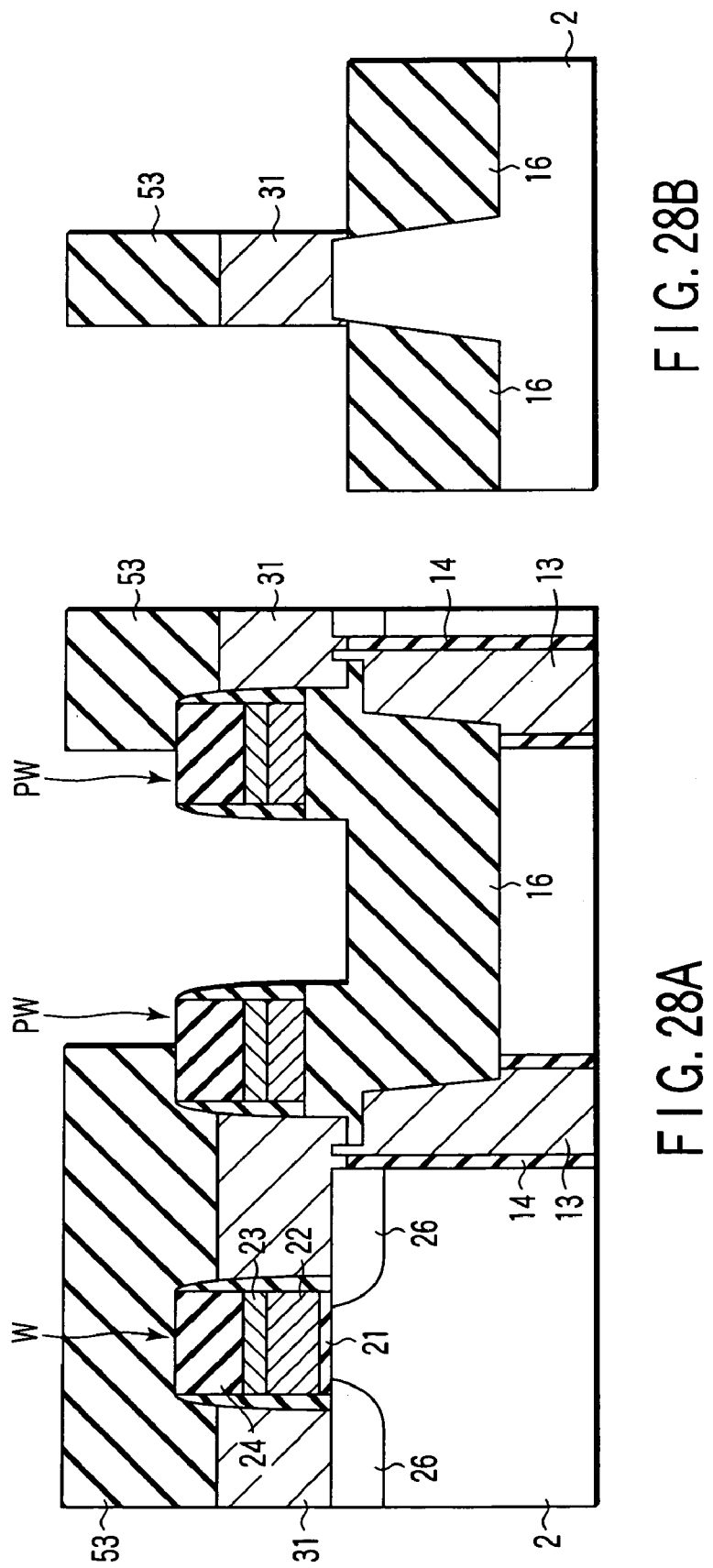

Next, the method of manufacturing the semiconductor memory device of FIGS. 25A and 25B will be described below referring to FIGS. 26A and 26B to FIGS. 28A and 28B. FIGS. 26A, 27A and 28A show, in sequence, parts of manufacturing processes of the configuration of FIG. 25A. FIGS. 26B, 27B and 28B show, in sequence, parts of manufacturing processes of the configuration of FIG. 25B. It is to be noted that FIG. 26A to FIG. 28A, FIG. 26B to FIG. 28B only show parts above the well 2.

First, the same processes as the processes up to FIGS. 8A and 8B of the first embodiment are performed. Next, as shown in FIGS. 26A, 26B, part of the element separation insulating film 16 is removed by etching by the RIE for example, with the word line W, the passing word line PW and the sidewall insulating film 25 as masks. As a result, the second portion 13b of the storage node 13 is exposed. This process is also performed under the slightly overetching condition, and the respective upper surfaces of the element separation insulating film 16, the first portion 15a of the TTO film 15 and the collar oxide film 14 are retreated to a height below the surface of the semiconductor substrate 1.

Next, as shown in FIGS. 27A and 27B, the material film of the connection conductive layer 31 is deposited on the entire surface on the semiconductor substrate 1 and etched back to a position slightly lower than an upper end of the gate structure. In this process, the material film of the connection conductive layer 31 contacts the side surface of the semiconductor substrate 1 exposed above the element separation insulating film 16. However, the height of this contact area is about the same as a distance between the upper surface of the second portion 13b of the storage node 13 (the surface of the semiconductor substrate 1) and the upper surface of the first portion 15a of the TTO film 15, which is smaller than in the conventional configuration.

Next, as shown in FIGS. 28A and 28B, a mask material 53 having an opening between the passing word lines PW is formed on the entire surface on the semiconductor substrate 1. Then, part of the connection conductive layer 31 is removed by etching, by the RIE for example, with the mask material 53 as a mask. As a result, the connection conductive layer 31 at a position extending on the source/drain diffusion layers 26 and the storage node 13 remains.

Next, as shown in FIGS. 25A and 25B, the barrier film 32 is formed to cover the connection conductive layer 31 after the mask material 53 is removed. The interlayer insulating films 33 are filled between the word lines W and the passing word line PW. Subsequently, the contact 36 and the wiring layer 35 are formed on the entire surface on the semiconductor substrate 1 after the interlayer insulating film 34 is formed.

In the semiconductor memory device according to the third embodiment, the storage node 13 has the first portion 13a and the second portion 13b having an upper surface higher than the upper surface of the first portion 13a, as in the first embodiment. Therefore, the same effects as in the first embodiment can be obtained.

(Fourth Embodiment)

A fourth embodiment differs from the second embodiment in the method of manufacturing the semiconductor memory device and therefore in the configuration of several additional parts. The configuration of the additional parts that differ from the second embodiment is the same as that of the third embodiment.

Figure 29A:
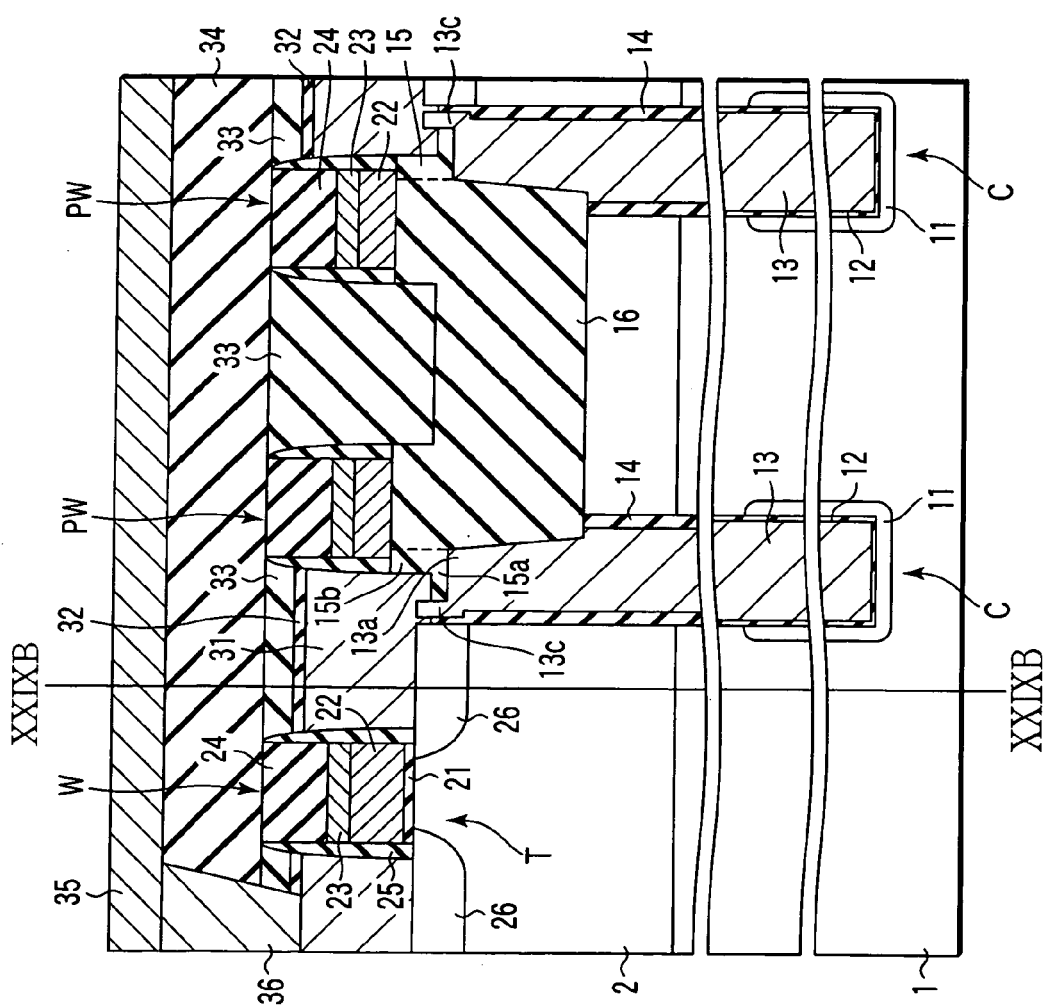
FIGS. 29A and 29B are diagrams showing sectional configurations of the semiconductor memory device according to a fourth embodiment of the present invention.
Figure 29B:
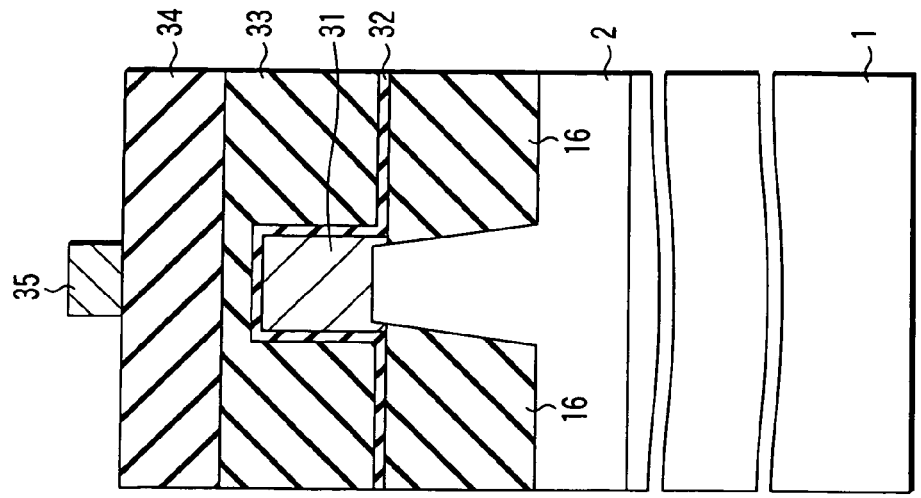

FIGS. 29A, 29B schematically show sectional configurations of the semiconductor memory device according to the fourth embodiment of the present invention. FIG. 29B is a sectional view taken along the line XXIXB—XXIXB in FIG. 29A and perpendicular to FIG. 29A.

As shown in FIGS. 29A and 29B, the configuration of the semiconductor memory device in the fourth embodiment has a shape combining the second embodiment and the third embodiment. More specifically, in this configuration, the storage node 13 and the collar oxide film 14 having the configuration of the third embodiment are replaced with those of the second embodiment. Others have the same configuration as in the third embodiment.

Figure 30B:
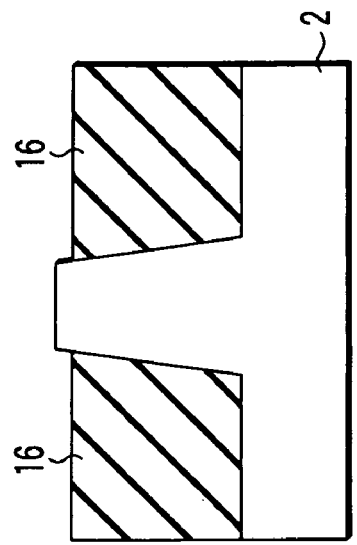
FIGS. 30B, 31B and 32B are diagrams showing; in sequence, parts of the manufacturing processes of the semiconductor memory device of FIG. 29B.
Figure 30A:
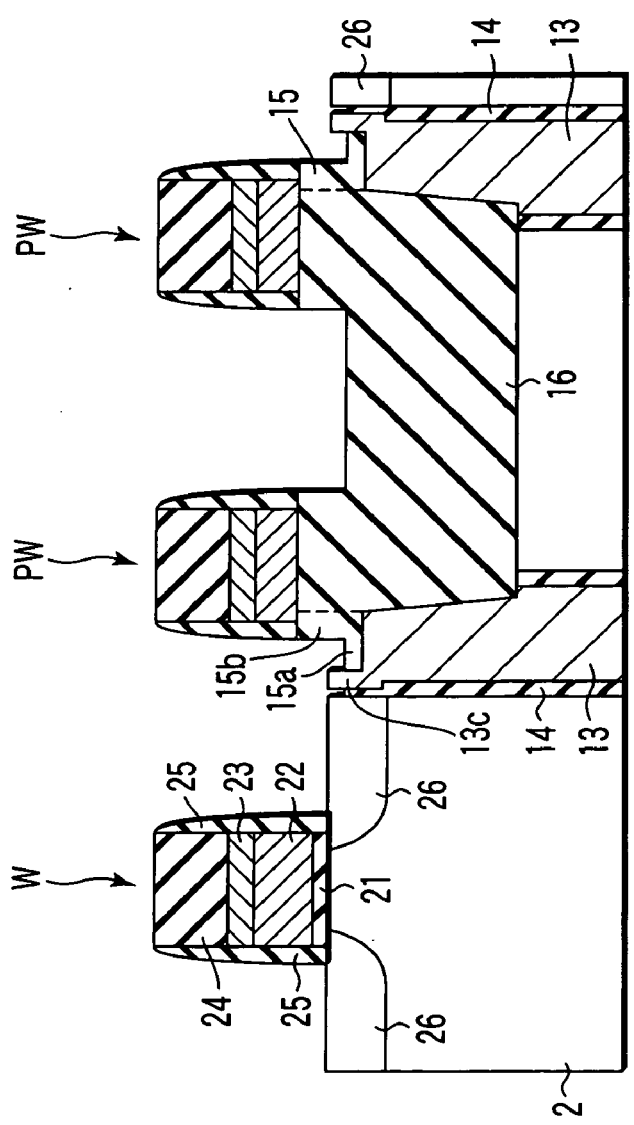
FIGS. 30A, 31A and 32A are diagrams showing, in sequence, parts of the manufacturing processes of the semiconductor memory device of FIG. 29A.
Figure 31B:
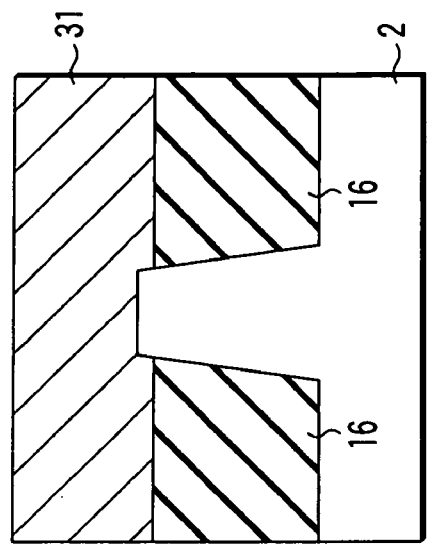
Figure 31A:
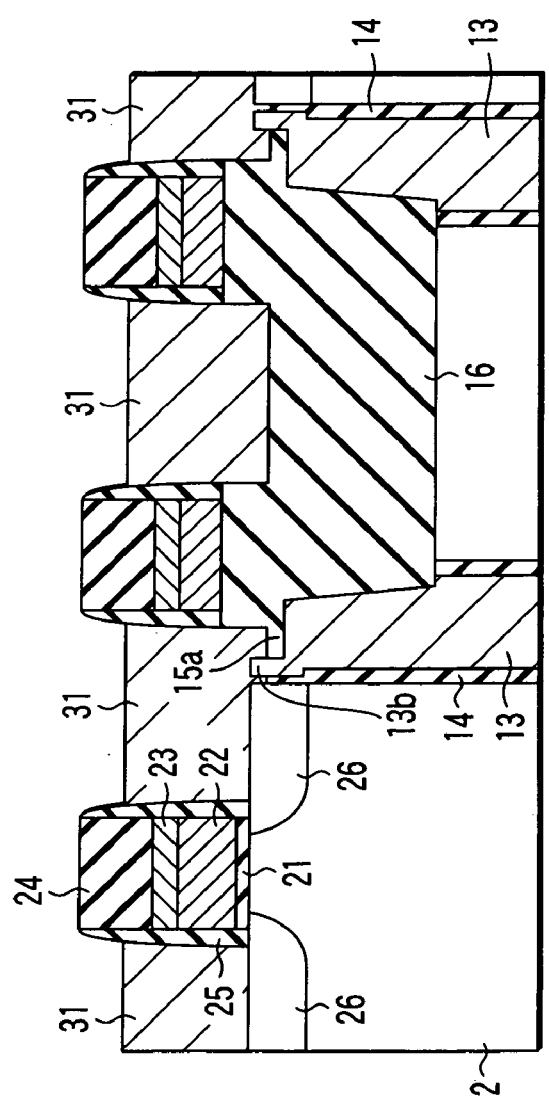
Figures 32A, 32B:
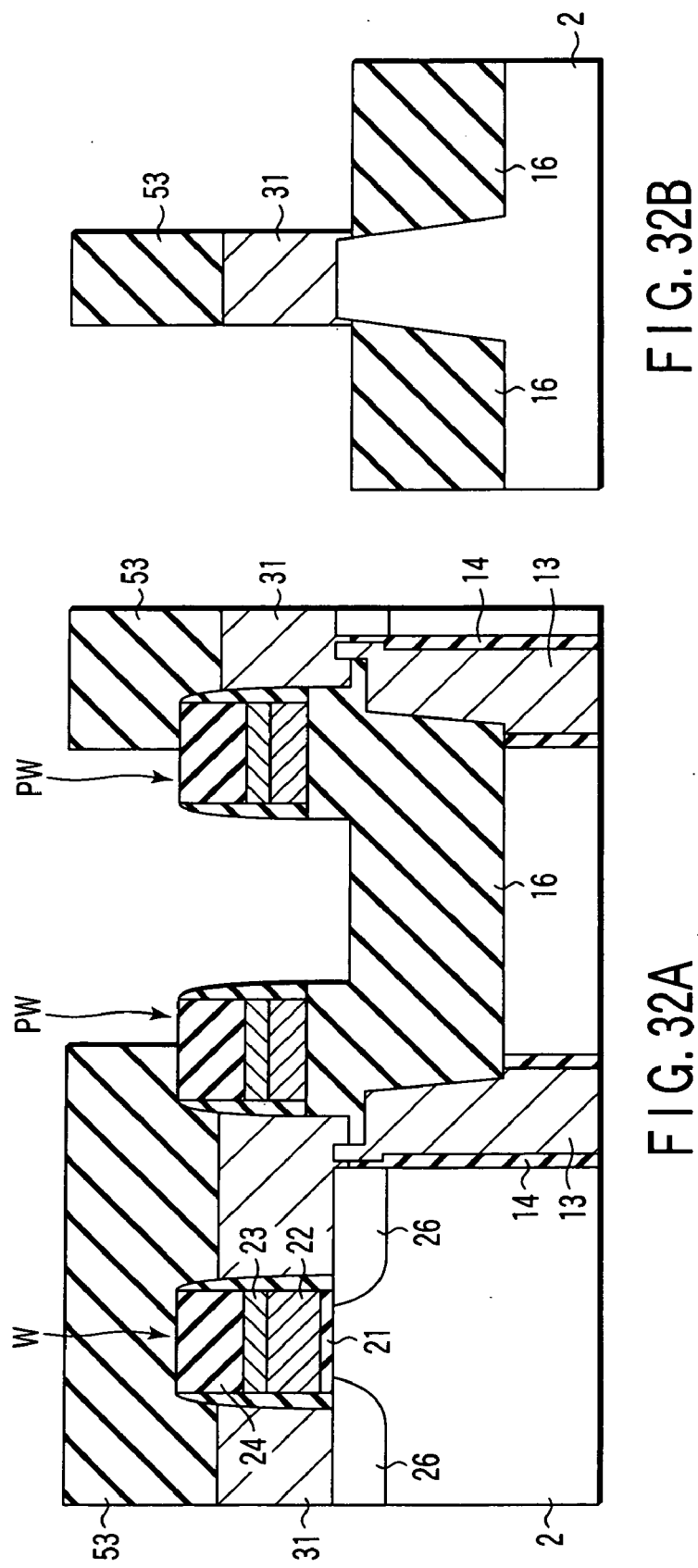

Next, the method of manufacturing the semiconductor memory device of FIGS. 29A and 29B will be described below referring to FIGS. 30A and 30B to FIGS. 32A and 32B. FIGS. 30A, 31A and 32A show, in sequence, parts of manufacturing processes of the configuration of FIG. 29A. FIGS. 30B, 31B and 32B show, in sequence, parts of manufacturing processes of the configuration of FIG. 29B. It is to be noted that FIG. 30A to FIG. 32A, FIG. 30B to FIG. 32B only show parts above the well 2.

First, the same processes as the processes up to FIGS. 21A and 21B of the second embodiment are performed. Next, as shown in FIGS. 30A and 30B, the same process as the process in FIGS. 26A and 26B of the third embodiment is performed, thereby removing part of the element separation insulating film 16. As a result, the second portion 13c of the storage node 13 is exposed, and the respective upper surfaces of the element separation insulating film 16, the first portion 15a of the TTO film 15 and the collar oxide film 14 are retreated to a height below the surface of the semiconductor substrate 1.

Next, as shown in FIGS. 31A, 31B, the same process as the process in FIGS. 27A and 27B of the third embodiment is performed, thereby forming the connection conductive layer 31 to a position slightly lower than the upper end of the gate structure.

Next, as shown in FIGS. 32A and 32B, the same process as the process in FIGS. 28A and 28B of the third embodiment is performed, whereby the connection conductive layer 31 at the position extending on the source/drain diffusion layers 26 and the storage node 13 remains.

Next, as shown in FIGS. 29A and 29B, the same process as the process in FIGS. 25A and 25B of the third embodiment is performed, thereby removing the mask material 53 and forming the barrier film 32. Subsequently, the interlayer insulating films 33 are filled between the word lines W and the passing word lines PW, and the interlayer insulating film 34 is formed, and then the contact 36 and the wiring layer 35 are formed.

In the semiconductor memory device according to the fourth embodiment, the storage node 13 has the first portion 13a and the second portion 13b having an upper surface higher than the upper surface of the first portion 13a, as in the first embodiment. Therefore, the same effects as in the first embodiment can be obtained.

Furthermore, according to the fourth embodiment, the second portion 13c of the storage node 13 has a width as large as that in the second embodiment. Thus, the same effects as in the second embodiment can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an element separation insulating film;
   a diffusion layer which is formed around a bottom of a trench formed in a surface of the semiconductor substrate;
   a first insulating film provided on an inner surface of the trench, the first insulating film including a capacitor insulating film formed in a lower portion of the trench and a collar oxide film formed in an upper portion of the trench;
   a conductive film which is filled in the trench and which has a first portion, a second portion and a third portion, the first portion being surrounded by the capacitor insulating film, the second portion being surrounded by the collar oxide film and the element separation insulating film, and the third portion having an upper surface higher than that of the second portion;
   a second insulating film which is provided on the second portion of the conductive film and which has a first portion and a second portion, the first portion contacting the third portion of the conductive film and having an upper surface lower than the surface of the third portion of the conductive film, the second portion having an upper surface higher than the surface of the semiconductor substrate;
   a first gate electrode provided on the second insulating film;
   a second gate electrode provided above the semiconductor substrate away from the first gate electrode;
   source/drain diffusion layers which are formed in the surface of the semiconductor substrate and which sandwich a channel area under the second gate electrode; and
   a connection conductive layer extending on the conductive film and on one of the source/drain diffusion layers.

2. The device according to claim 1, wherein
   the second portion of the second insulating film has an edge common to a sidewall of the first gate electrode.

3. The device according to claim 2, wherein
   thickness of the second portion of the second insulating film is from 30 nm to 80 nm.

4. The device according to claim 3, wherein
   the third portion of the conductive film is located as high as the surface of the semiconductor substrate.

5. The device according to claim 2, wherein
   the connection conductive layer has a contact portion contacting a sidewall of the semiconductor substrate.

6. The device according to claim 5, wherein
   a lower surface of the contact portion of the connection conductive layer faces the first insulating film formed on the surface of the semiconductor substrate, and a portion at which the contact portion faces the first insulating film is located as high as the first portion of the second insulating film.

7. The device according to claim 6, wherein
   a distance from an upper surface of the second portion of the second insulating film to an upper surface of the first portion of the second insulating film is 120% to 150% of a distance from the upper surface of the second portion of the second insulating film to an upper surface of the third portion of the conductive film.

8. The device according to claim 1, further comprising:
   a barrier film covering a side surface of a gate structure including the first gate electrode and the upper surface of the second insulating film.

9. The device according to claim 1, wherein the second insulating film is part of an the element separation insulating film.

10. The device according to claim 1, further comprising:
    a barrier film covering an upper surface and side surfaces of the connection conductive layer and the upper surface of the second insulating film.

11. The device according to claim 1, wherein
    the third portion of the conductive film projects toward the first insulating film.

12. The device according to claim 1, wherein the connection conductive layer is in contact with a side of the third portion of the conductive film above the first portion of the second insulating film.

* * * * *